(12) United States Patent
Zou et al.

(10) Patent No.: US 10,020,420 B2
(45) Date of Patent: Jul. 10, 2018

(54) REPAIRING METHOD, MANUFACTURING METHOD, DEVICE AND ELECTRONIC APPARATUS OF MICRO-LED

(71) Applicant: Goertek.Inc, Shandong (CN)

(72) Inventors: Quanbo Zou, Shandong (CN); Zhe Wang, Shandong (CN)

(73) Assignee: GoerTek Inc., Weifang-Shandong (CN)

( * ) Notice: Subject to any disclaimer, the term of this patent is extended or adjusted under 35 U.S.C. 154(b) by 0 days.

(21) Appl. No.: 15/529,602

(22) PCT Filed: Aug. 18, 2015

(86) PCT No.: PCT/CN2015/087414
§ 371 (c)(1),
(2) Date: May 25, 2017

(87) PCT Pub. No.: WO2017/028206
PCT Pub. Date: Feb. 23, 2017

(65) Prior Publication Data
US 2017/0263811 A1  Sep. 14, 2017

(51) Int. Cl.
*H01L 33/00* (2010.01)
*H01L 25/075* (2006.01)
*H01L 33/62* (2010.01)

(52) U.S. Cl.
CPC ...... *H01L 33/0095* (2013.01); *H01L 25/0753* (2013.01); *H01L 33/0079* (2013.01); *H01L 33/62* (2013.01); *H01L 2933/0066* (2013.01)

(58) Field of Classification Search
CPC . H01L 33/0095; H01L 25/0753; H01L 33/62; H01L 33/0079; H01L 2933/0066
USPC .......................................................... 438/4
See application file for complete search history.

(56) References Cited

U.S. PATENT DOCUMENTS

| 6,961,993 B2 | 11/2005 | Oohata |
| 8,333,860 B1 | 12/2012 | Bibl et al. |
| 8,361,268 B2 | 1/2013 | Mizuno et al. |
| 8,426,227 B1 | 4/2013 | Bibl et al. |

(Continued)

FOREIGN PATENT DOCUMENTS

| CN | 1349205 A | 5/2002 |
| CN | 101859728 A | 10/2010 |
| JP | 2002-311858 A | 10/2002 |

OTHER PUBLICATIONS

International Searching Authority, International Search Report and Written Opinion for International Application No. PCT/CN2015/087414, dated May 18, 2016, 7 pages, State Intellectual Property Office of the P.R.C., China.

*Primary Examiner* — Caleen Sullivan
(74) *Attorney, Agent, or Firm* — Alston & Bird LLP

(57) ABSTRACT

A repairing method, manufacturing method, device and electronic apparatus of micro-LED are disclosed. The method for repairing micro-LED defects comprises: obtaining a micro-LED defect pattern on a receiving substrate; forming micro-LEDs (703b) corresponding to the defect pattern on a laser-transparent repair carrier substrate (707); aligning the micro-LEDs (703b) on the repair carrier substrate (707) with defect positions on the receiving substrate, and bringing the micro-LEDs (703b) into contact with pads at the defect positions; and irradiating the repair carrier substrate with a laser from the repair carrier substrate side, to lift-off the micro-LEDs from the repair carrier substrate (707).

12 Claims, 20 Drawing Sheets

(56) References Cited

U.S. PATENT DOCUMENTS

| | | | |
|---|---|---|---|
| 2002/0043923 A1 | 4/2002 | Natori | |
| 2002/0064032 A1* | 5/2002 | Oohata | H04N 9/30 |
| | | | 361/760 |
| 2004/0012337 A1 | 1/2004 | Oohata et al. | |
| 2010/0258543 A1* | 10/2010 | Mizuno | H01L 21/268 |
| | | | 219/121.72 |
| 2014/0312368 A1 | 10/2014 | Lee et al. | |

* cited by examiner

REPAIRING METHOD, MANUFACTURING METHOD, DEVICE AND ELECTRONIC APPARATUS OF MICRO-LED

CROSS REFERENCE TO RELATED APPLICATIONS

This application is a National Stage Application, filed under 35 U.S.C. § 371, of International Application No. PCT/CN2015/087414, filed Aug. 18, 2015; the contents of which as are hereby incorporated by reference in their entirety.

BACKGROUND

Related Field

The present invention relates to Micro-Light Emitting Diode (micro LED) array for display, and in particular, to a method for repairing micro-LED defects, a method for manufacturing a micro-LED device, a micro-LED device and an electronic apparatus containing a micro-LED device.

Description of Related Art

The micro-LED technology refers to the LED array of small size integrated on a substrate with high density. Currently, the micro-LED technology is starting development, and it is expected in the industry that a high-quality micro-LED product comes into the market. High-quality micro-LED will have a deep affection on the conventional display products such as LCD/OLED that have already been put into the market.

In the process of manufacturing micro-LEDs, micro-LEDs are first formed on a donor wafer, and then the micro-LEDs are transferred to a receiving substrate. The receiving substrate is a display screen, for example.

One difficulty during manufacturing a micro-LED lies in how to transfer a micro-LED from a donor wafer to a receiving substrate. In the prior art, the transfer is generally performed by means of electrostatic pick-up. A transfer head array will be needed during the electrostatic pick-up. The structure of the transfer head array is relatively complicated, and the stability thereof shall be considered. An extra cost shall be paid for manufacturing a transfer head array. A phase change shall be made before pick-up with the transfer head array. In addition, during manufacturing with a transfer head array, limitations apply to the thermo budget of a micro-LED for phase change, which is generally lower than 350° C., or more specifically, lower than 200° C.; otherwise, the performance of the micro-LED will be degraded. It generally requires two transfers during the manufacturing with transfer head array, i.e., the transfer from a donor wafer to a carrier wafer and the transfer from the carrier wafer to a receiving substrate.

U.S. Pat. No. 8,333,860B1 discloses an array of transfer heads for transferring micro devices, in which a voltage is applied to the electrode in the transfer head to pick-up a micro device. This patent is fully incorporated hereby as reference herein.

U.S. Pat. No. 8,426,227B1 discloses a method of forming a micro light emitting diode array, in which a micro-LED array is transferred to a receiving substrate by using a transfer head array. This patent is fully incorporated hereby as reference herein.

BRIEF SUMMARY

One object of this invention is to provide a new technical solution for repairing micro-LED defects.

According to an embodiment of the present invention, there is provided a method for repairing micro-LED defects, comprising: obtaining micro-LED defect pattern on a receiving substrate; forming micro-LEDs corresponding to the defect pattern on a laser-transparent repair carrier substrate; aligning the micro-LEDs on the repair carrier substrate with the defect positions on the receiving substrate, and bringing the micro-LEDs into contact with the pads at the defect positions; and irradiating the repair carrier substrate with laser from the repair carrier substrate side, to lift-off the micro-LEDs from the repair carrier substrate.

Preferably, the step of forming micro-LEDs corresponding to the defect pattern comprises: mounting the micro-LEDs onto a temporary substrate in the defect pattern; and transferring the micro-LEDs on the temporary substrate to the repair carrier substrate.

Preferably, an adhesive is coated on the temporary substrate, and the step of mounting the micro-LEDs onto a temporary substrate comprises: bringing micro-LEDs on a laser-transparent original substrate into contact with the adhesive; irradiating the original substrate with laser in the defect pattern, to lift-off the micro-LEDs from the original substrate; and keeping the lifted-off micro-LEDs in the defect pattern on the temporary substrate while releasing the un-lifted-off micro-LEDs through a partial adhesive releasing.

Preferably, the step of transferring the micro-LEDs on the temporary substrate to the repair carrier substrate comprises: bonding the micro-LEDs on the temporary substrate onto the repair carrier substrate; and lifting-off the micro-LEDs from the temporary substrate through a complete adhesive releasing.

Preferably, the micro-LEDs on the temporary substrate is bonded onto the repair carrier substrate through a polymer thin film, and at least one part of the polymer thin film is removed after the micro-LEDs is lifted-off from the temporary substrate.

Preferably, the adhesive is a UV tape, and the temporary substrate is a PET plate.

Preferably, the partial adhesive releasing and the complete adhesive releasing are performed through UV exposure.

Preferably, the exposure time or energy used in the partial adhesive releasing is less than the standard exposure time or energy, and the exposure time or energy used in the complete adhesive releasing is higher than or equal to the standard exposure time or energy.

Preferably, the repair carrier substrate is a sapphire substrate.

According to another embodiment of the present invention, there is provided a method for manufacturing a micro-LED device, comprising repairing micro-LED defects on a receiving substrate by using the method according to the present invention.

According to another embodiment of the present invention, there is provided a micro-LED device, which is manufactured by using the method according to the present invention.

According to another embodiment of the present invention, there is provided an electronic apparatus, containing a micro-LED device according to the present invention.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that content which is not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

Figure 1:
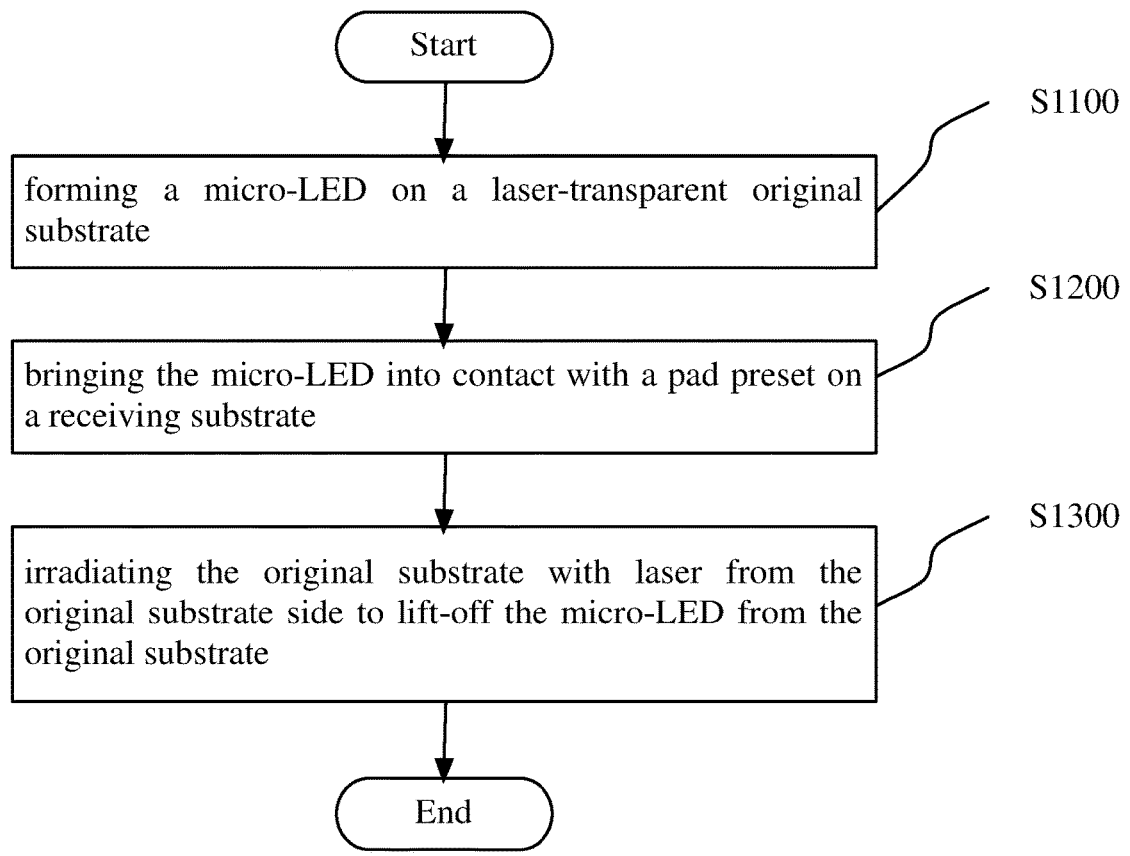
FIG. 1 shows a flow chart of an illustrative embodiment of the method according to the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described below with reference to the drawings.

FIG. 1 shows a flow chart of an illustrative embodiment of the method for transfer micro-LED according to the present invention.

As shown in FIG. 1, at step S1100, a micro-LED is formed on a laser-transparent original substrate.

The laser-transparent original substrate can be a sapphire substrate, SiC substrate and so on, for example. The micro-LED can be used for being mounted on a display screen panel.

It should be understood by a person skilled in the art that one micro-LED could be formed on the original substrate, or a plurality of micro-LED could be formed on the original substrate. For example, a plurality of micro-LEDs can be formed on the laser-transparent original substrate. The plurality of micro-LEDs can form an array.

In an example, in a case where a plurality of micro-LEDs are formed on the laser-transparent original substrate, the original substrate can be singulated or divided into multiple pieces for more flexible transferring.

At step S1200, the micro-LED is brought into contact with a pad preset on a receiving substrate.

For example, the receiving substrate is a display screen panel.

For example, the pad can be set for red pixel array, yellow pixel array or blue pixel array.

In an example, in a case where a plurality of micro-LED are formed, at least one micro-LED of the plurality of micro-LEDs can be brought into contact with at least one pad preset on the receiving substrate. The at least one micro-LED could be one, several or all of the plurality of micro-LEDs. It should be understood by a person skilled in the art that, although it is just described here that at least one micro-LED, which is expected to be lifted-off, is in contact with a pad, a remaining micro-LED of the plurality of micro-LEDs can also be in contact with a pad.

For example, in the step of contact (S1200), the micro-LED can be brought into contact with the pad preset on the receiving substrate via a liquid thin film. For example, the liquid thin film can include flux. Herein, the lift-off of a micro-LED will be easy through the surface tension force of the liquid thin film (flux), and the successful rate is high.

At step S1300, the original substrate is irradiated with laser from the original substrate side to lift-off the micro-LED from the original substrate.

In an example, in a case where at least one micro-LED is in contact with pad, at least one area on the original substrate can be irradiated with laser from the original substrate side to lift-off the at least one micro-LED from the original substrate. For example, a technician can select the at least one area. For example, the at least one area corresponds to the at least micro-LED, respectively. The at least one area can be just partial area on the original substrate, or can be the whole area.

In another example, the original substrate can be offset for transferring additional micro-LED s.

In another example, after the transferring using the original substrate, an additional laser-transparent backup substrate can be used to cope with a situation in which micro-LEDs are missing at some points on the display screen panel. For example, a micro-LED can be formed on an additional laser-transparent backup substrate; the micro-LED on the backup substrate is brought into contact with a pad preset on a receiving substrate; and the backup substrate is irradiated with laser from the backup substrate side to lift-off the micro-LED from the backup substrate. In such a way, the quality of a display screen can further be improved.

An array of micro-LEDs can be formed on the receiving substrate after the transferring of micro-LEDs to the receiving substrate.

After the transferring of micro-LEDs to the receiving substrate, the present invention can further include subsequent steps.

For example, the lifted-off micro-LEDs can be reflow-soldered on the receiving substrate. A negative electrode can be deposited on the micro-LEDs. The reflow-soldering can be performed after micro-LEDs of each color are transferred. Alternatively, the reflow-soldering can be performed after micro-LEDs of all colors are transferred.

In addition, the soldered micro-LED can be filled with polymer. For example, a confocal dielectric deposition can be used in stead of polymer filling.

In another embodiment, the present invention further includes a method for manufacturing a micro-LED device. The manufacturing method comprises transferring a micro-LED to a receiving substrate by using the method for transferring a micro-LED according to the present invention.

In another embodiment, the present invention further includes a micro-LED device, such as a display screen device. The micro-LED device can be manufactured by using the method for manufacturing a micro-LED device according to the present invention.

In comparison with the prior art, under the similar conditions, the micro-LED manufactured by using the solution of the present invention is relatively simple and reliable while maintaining a high quality, and the through put thereof is relatively high with low cost.

In another embodiment, the present invention further includes an electronic apparatus. The electronic apparatus contains a micro-LED device according to the present invention. For example, the electronic apparatus can be a mobile phone, a pad computer and so on.

In the solution of the present invention, a micro-LED is formed directly on the original substrate and it is transferred to a receiving substrate by means of laser lift-off. The solution of this invention have not been conceived by the prior art.

In addition, the micro-LED can be selectively transferred through the present invention.

In addition, in the solution of the present invention, the transfer can be performed only once while two transfers are needed in the prior art.

In addition, in comparison with the prior art, the solution of the present invention is relatively efficient, the cost is relatively low and product performance degrade due to an extra thermal budget will not occur.

In addition, in comparison with the prior art using a pick-up head, the present invention does not need a complicated pick-up system, and thus the cost of product manufactured using the present invention will relatively low and reliable.

In addition, since it does not need the temporary bonding in the prior art between the micro-LED and the intermediate carrier substrate, the cost can be further decreased by this invention.

Since it is not necessary to consider the phase change of bonding layer considered in the prior art using pick-up head, the manufacturing method of the present invention can have a relatively high through put and the extra thermal load limitation will be less. Consequently, under the similar conditions, the manufactured micro-LED will have a higher performance.

An example for transferring a micro-LED according to the present invention will be described below with reference to FIGS. 2A to 2G.

Figure 2A:
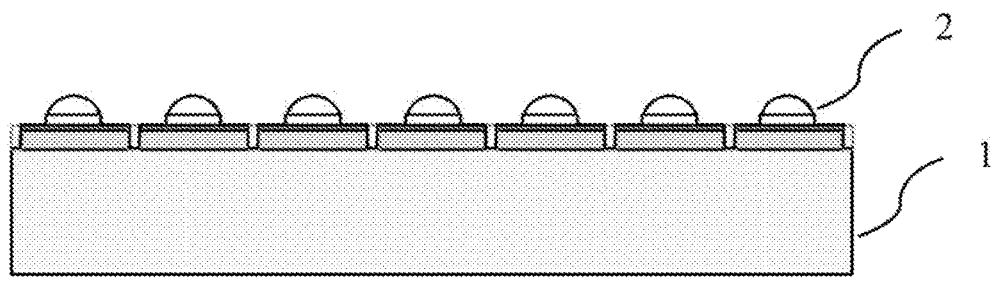
FIGS. 2A to 2G shows an example for transferring a micro-LED according to the present invention.

As shown in FIG. 2A, micro-LEDs 2 are formed on a laser-transparent original substrate 1 such as sapphire substrate. The micro-LEDs 2 have a vertical micro-LED structure, for example. The micro-LEDs 2 contains, for example, a n-doped GaN layer, a multiple quantum well structure, a p-doped GaN layer, a p metal electrode, a bump, and so on.

As shown in FIG. 2A, the plurality of micro-LEDs 2 can be singulated.

Figure 2B:
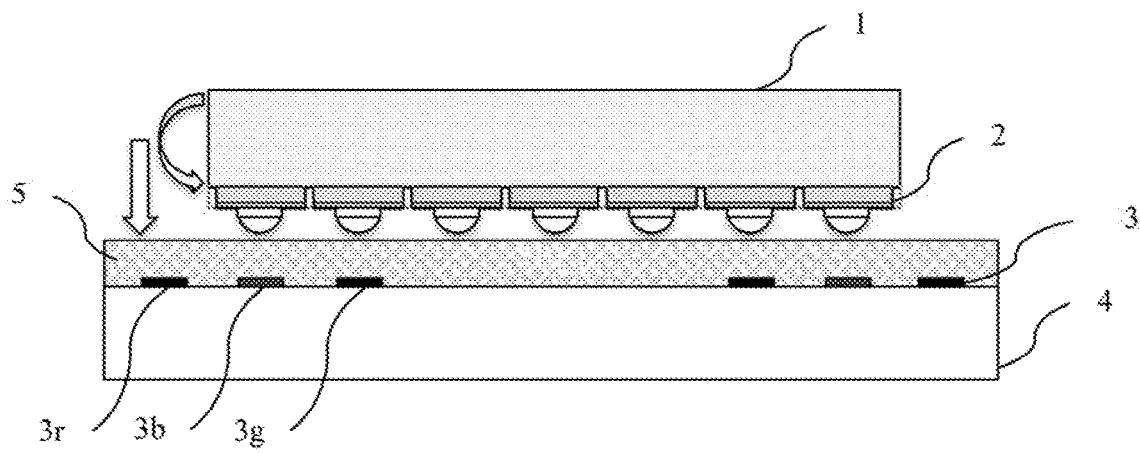

As shown in FIG. 2B, the original substrate 1 is flipped over, and is aligned with a receiving substrate 4 with liquid thin film (for example, containing flux) 5. The micro bumps on the micro-LEDs are in contact with the flux. Pads 3 are preset on the receiving substrate 4. For example, the pads 3 include pad 3r for receiving red micro-LED, pad 3b for receiving blue micro-LED and pad 3g for receiving green micro-LED.

Figure 2C:
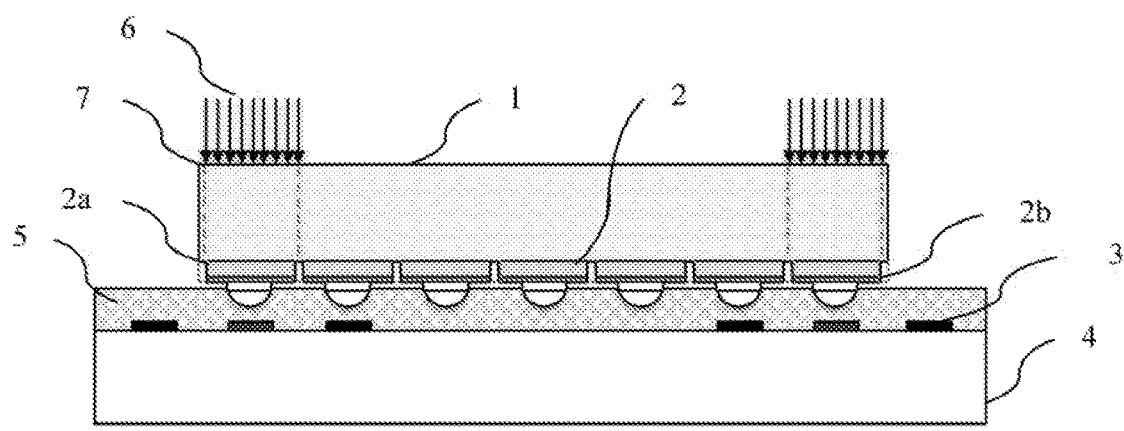

As shown in FIG. 2C, partial areas 7 on the original substrate are selectively irradiated with laser 7, to lift off the selected micro-LEDs 2a, 2b of the plurality of formed micro-LEDs from the original substrate.

Figure 2D:
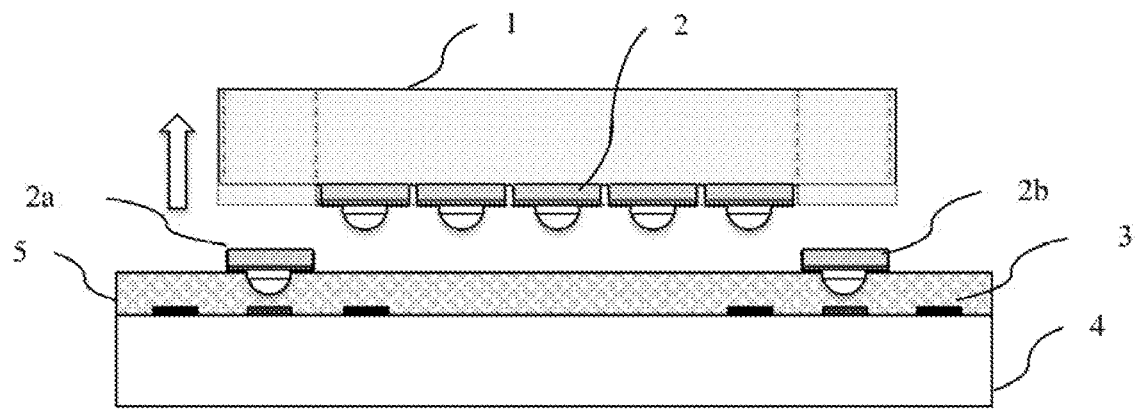

As shown in FIG. 2D, the original substrate 1 is lifted up. Because of the function of the surface tension force of the liquid thin film, the selected micro-LEDs 2a, 2b are lifted-off easily, while the other micro-LEDs are remained on the original substrate 1.

Then, the original substrate is moved and the operations of FIGS. 2C to 2D are repeated, so that a plurality of micro-LEDs are transferred to the receiving substrate.

Figure 2E:
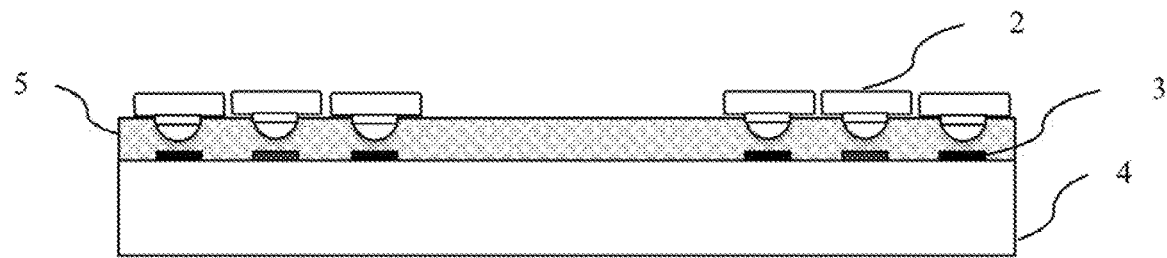

As shown in FIG. 2E, the plurality of micro-LEDs are transferred to the receiving substrate 4.

Figure 2F:
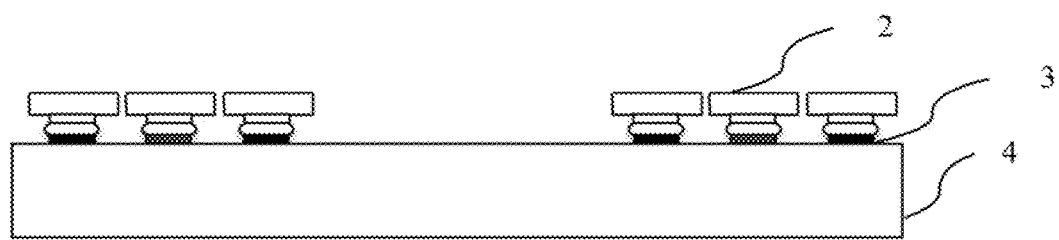

As shown in FIG. 2F, for example, the plurality of micro-LEDs are soldered onto the receiving substrate through reflow soldering. Then, the flux is cleaned.

Figure 2G:
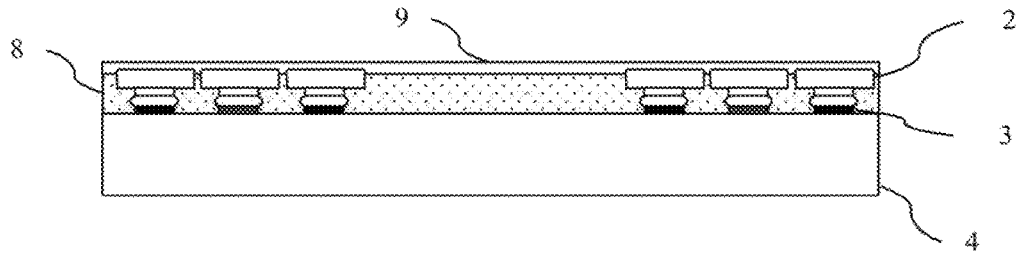

As shown in FIG. 2G, the receiving substrate is filled with polymer 8 and is sealed. Then, n-metal electrode 9 is deposited, for example, using ITO material.

Figure 3:
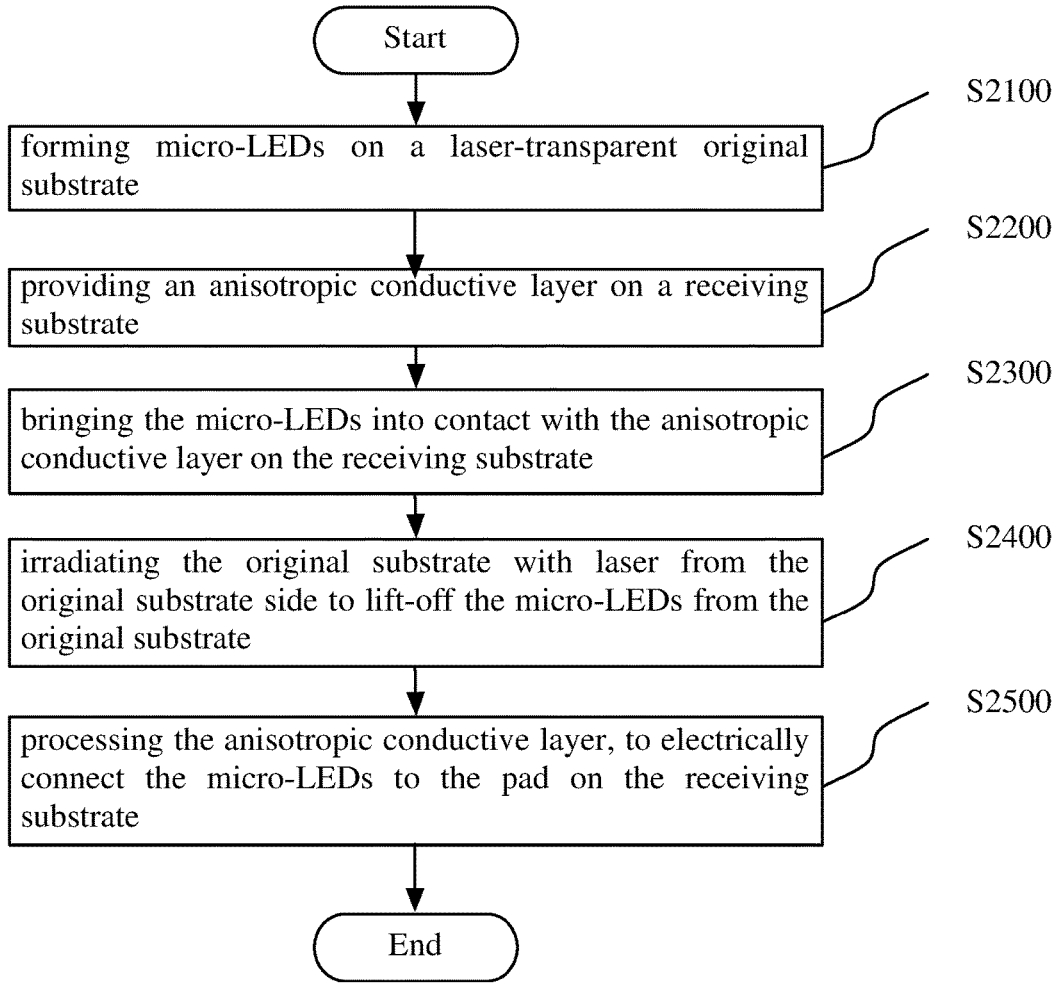
FIG. 3 shows a flow chart of another illustrative embodiment of the method according to the present invention.

FIG. 3 shows a flow chart of another illustrative embodiment of the method for transferring a micro-LED according to the present invention.

As shown in FIG. 3, at step S2100, micro-LEDs are formed on a laser-transparent original substrate.

At step S2200, an anisotropic conductive layer is provided on a receiving substrate.

For example, the anisotropic conductive layer is at least one of an anisotropic conductive film (ACF), an anisotropic conductive paste (ACP) and an anisotropic conductive tape (ACT).

At step S2300, the micro-LEDs are brought into contact with the anisotropic conductive layer on the receiving substrate. For example, the micro-LEDs are adhered to the anisotropic conductive layer on the receiving substrate. At this step, the micro-LEDs can be aligned with the receiving substrate in advance, for example.

At step S2400, the original substrate is irradiated with laser from the original substrate side to lift-off the micro-LEDs from the original substrate.

For example, the above steps can be performed with respect to red micro-LEDs, green micro-LEDs and blue micro-LEDs, respectively. Since the transfer with respect to the three micro-LEDs can be regarded as a simple repeat of the above steps, they are not repeated here. As long as each of the above steps are performed in a solution, the solution will be covered by this invention.

At step S2500, the anisotropic conductive layer is processed to electrically connect the micro-LEDs (its electrodes) with the pads on the receiving substrate.

In an example, pressure can be applied on the anisotropic conductive layer from the micro-LED side by using an auxiliary substrate. For example, the temperature of processing the anisotropic conductive layer can be between 150° C. and 200° C. For example, the applied pressure is between 1 MPa and 4 MPa. For example, the time period of applying pressure is between 10 second and 30 second.

In an example, the auxiliary substrate can be a flat rigid substrate. The inventors of the present application have found that the possible displacement of the micro-LEDs can be reduced by using a rigid substrate. This point has not noticed by a person skilled in the art.

For example, the surface of the auxiliary substrate can be coated with temporary bonding polymer. In this situation, the step S2500 can further comprises: bonding the auxiliary substrate with the anisotropic conductive layer via the temporary bonding polymer; and after applying pressure, de-bonding the auxiliary substrate via the temporary bonding polymer, to remove the auxiliary substrate. The advantage of temporarily bonding the auxiliary substrate with the anisotropic conductive layer lies in that, the positions of the micro-LEDs can be relatively fixed, and the displacement of micro-LEDs during processing the anisotropic conductive layer is reduced.

After the above processes, normal subsequent processes can be done on the micro-LEDs. For example, the subsequent processes include: etching the temporary bonding polymer, to expose the epitaxial layers of the micro-LEDs; forming N-metal electrodes on the epitaxial layers of the micro-LEDs; and performing encapsulation on the N-metal electrodes.

For example, the receiving substrate can be a display substrate. Leads and pads can be set on the receiving substrate in advance, to be electronically connect with the micro-LED s.

In this embodiment, the micro-LEDs and the receiving substrate are connected through a anisotropic conductive layer. This approach of processing is relatively simple and is more suitable for production in large bulk.

In another embodiment, the present invention further provides a method for manufacturing a micro-LED device. The manufacturing method comprises transferring micro-LEDs to a receiving substrate by using the method according to the present invention. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to the present invention. In the micro-LED device according to the embodiment, the micro-LEDs come into electronic contact with the pads on the receiving substrate via the anisotropic conductive layer, which is different from the micro-LED device in the prior art.

In another embodiment, the present invention further provides an electronic apparatus. The electronic apparatus contains a micro-LED device according to the embodiment. For example, the electronic apparatus can be a mobile phone, a pad and so on.

FIGS. 4A to 4L shows another example for transferring a micro-LED according to the present invention.

Figure 4A:
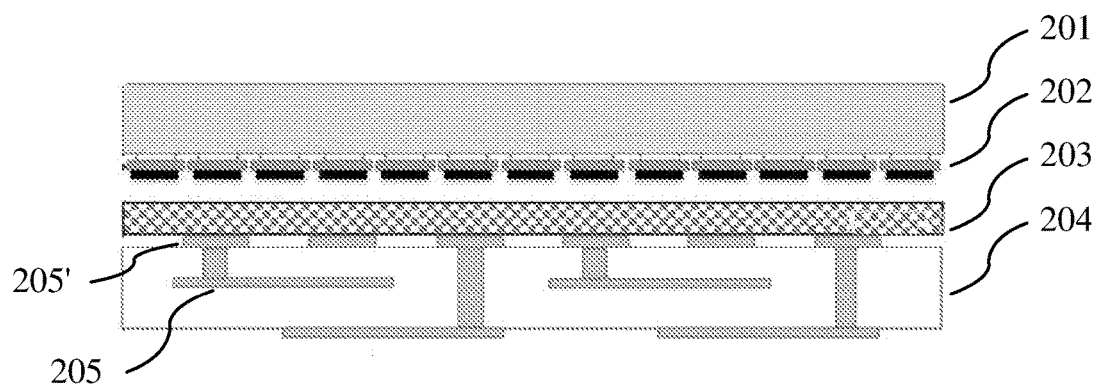
FIGS. 4A to 4L show another example for transferring a micro-LED according to the present invention.

As shown in FIG. 4A, an original substrate 201 such as a sapphire substrate has red micro-LEDs 202 thereon. The receiving substrate 204 such as display substrate has an anisotropic conductive film (ACF) 203 thereon. The receiving substrate 204 has signal leads 205 and pads 205' for connecting micro-LEDs.

Figure 4B:
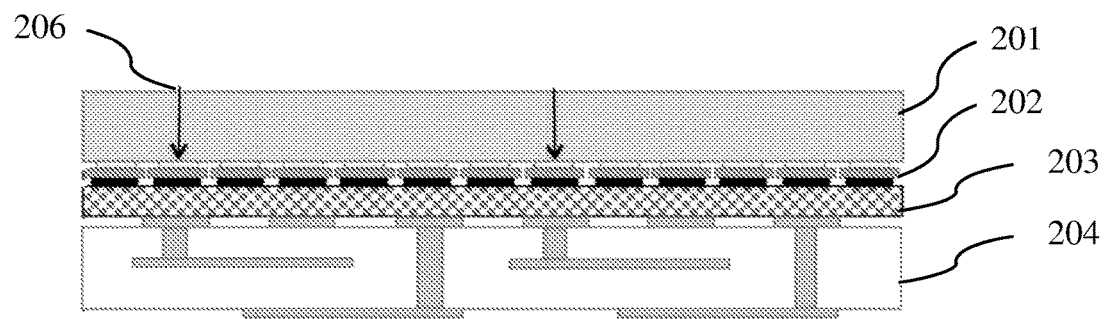

As shown in FIG. 4B, the original substrate 201 (red micro-LED 202) is brought into contact with the anisotropic conductive film 203 with a light force. For example, the red micro-LEDs 202 to be transferred can be aligned with the pads on the receiving substrate 204. The original substrate 201 is irradiated with laser 206, to selectively lift-off red micro-LEDs.

Figure 4C:
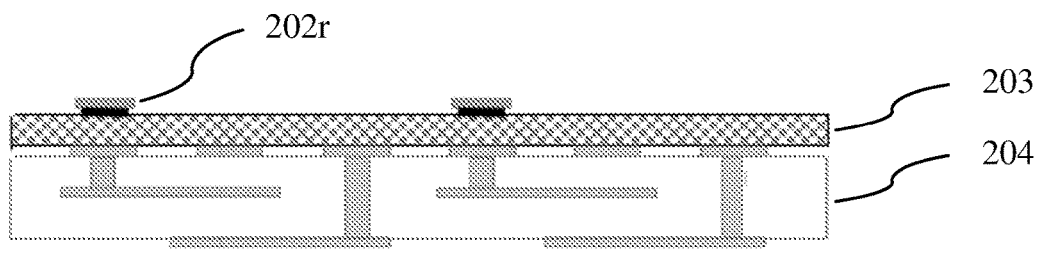

FIG. 4C shows lifted-off red micro-LEDs 202r.

Figure 4D:
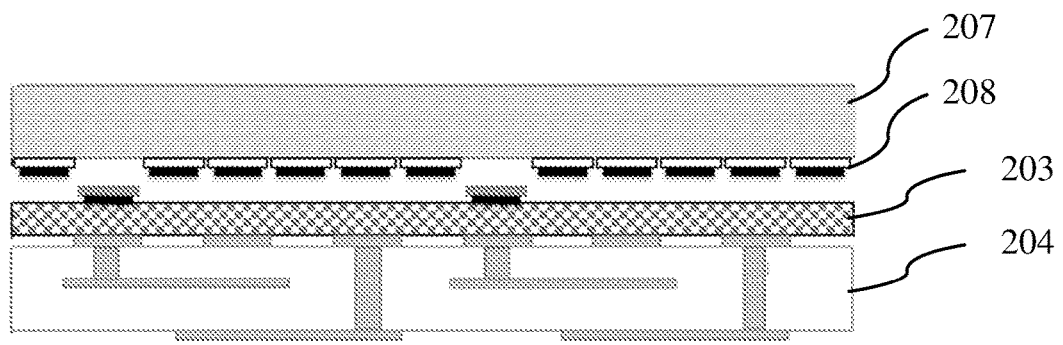

FIG. 4D shows an original substrate 207 and the green micro-LEDs 208 thereof. The green micro-LEDs to be lifted-off are aligned with the pads on the receiving substrate 204.

Figure 4E:
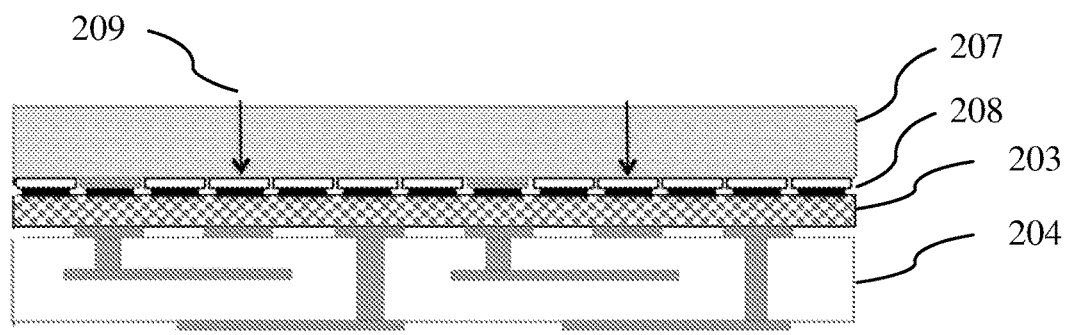

FIG. 4E shows the situation in which the green micro-LEDs 208 are in contact with the anisotropic conductive film 203 with a light force. At least one green micro-LED is selectively lifted-off by using laser 209.

Figure 4F:
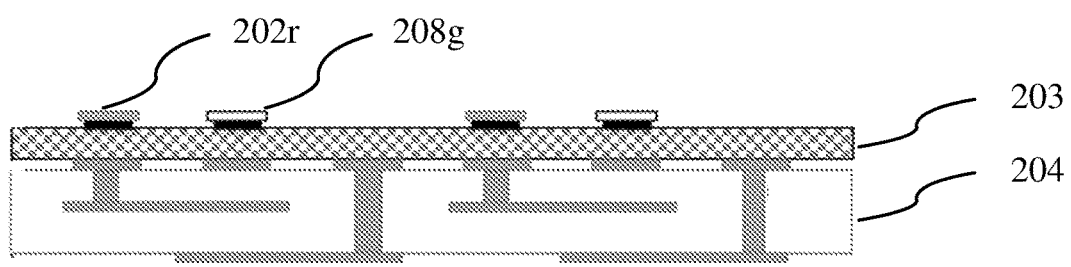

FIG. 4F shows lifted-off red micro-LEDs 202r and green micro-LEDs 208g.

Figure 4G:
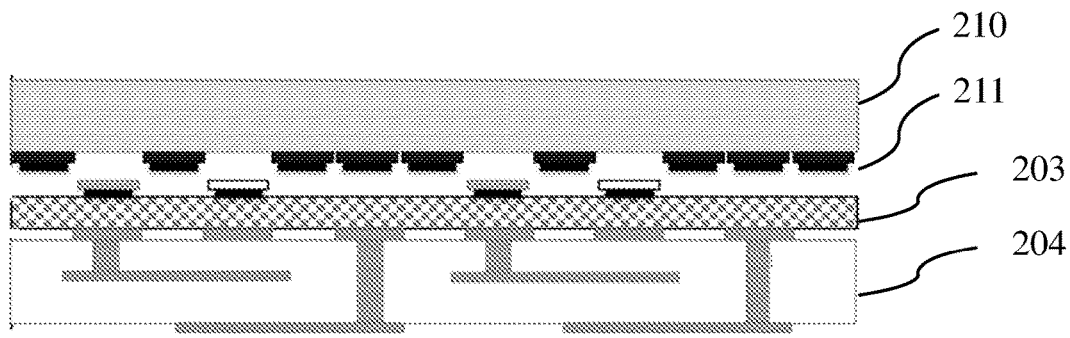

FIG. 4G shows an original substrate 210 and the blue micro-LEDs 211 thereof. The blue micro-LEDs to be lifted-off are aligned with the pads on the receiving substrate 204.

Figure 4H:
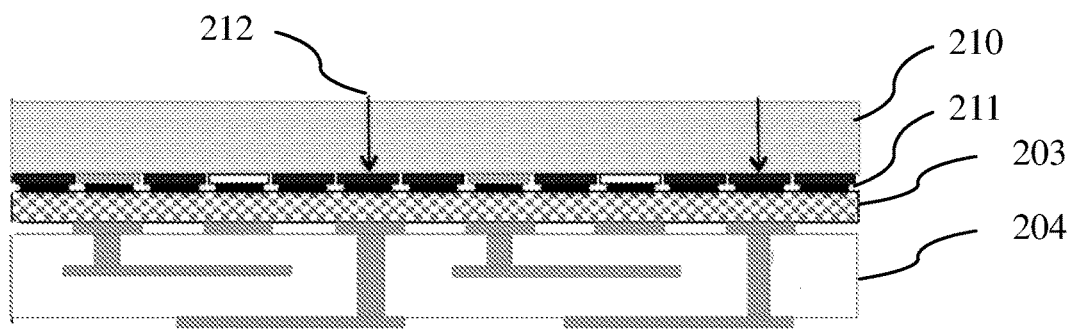
Figure 4I:
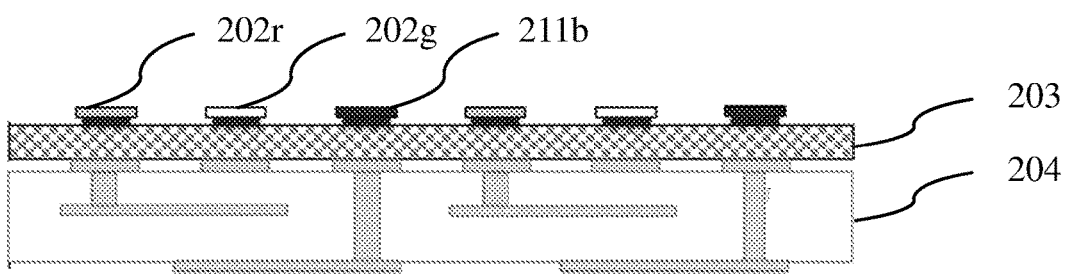

FIG. 4H shows the situation in which the blue micro-LEDs 211 are in contact with the anisotropic conductive film 203 with a light force. At least one blue micro-LED is selectively lifted-off by using laser 212.

FIG. 4F shows lifted-off red micro-LEDs 202r, green micro-LEDs 208g and blue micro-LEDs 211b.

After the transfer of micro-LEDs in the three colors, an inspection and repair can be performed with respect to any defect.

Figure 4J:
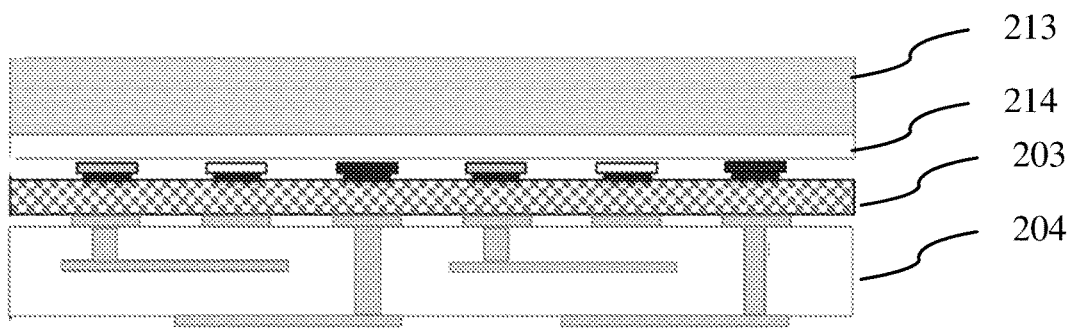

FIG. 4J shows an auxiliary substrate 213. The auxiliary substrate 213 is a flat rigid substrate, such a glass substrate. Polymer 214 such as 3M LC5200/5320 is coated on the auxiliary substrate 213. The polymer can be cured through UV and can be de-bonded through red laser.

Figure 4K:
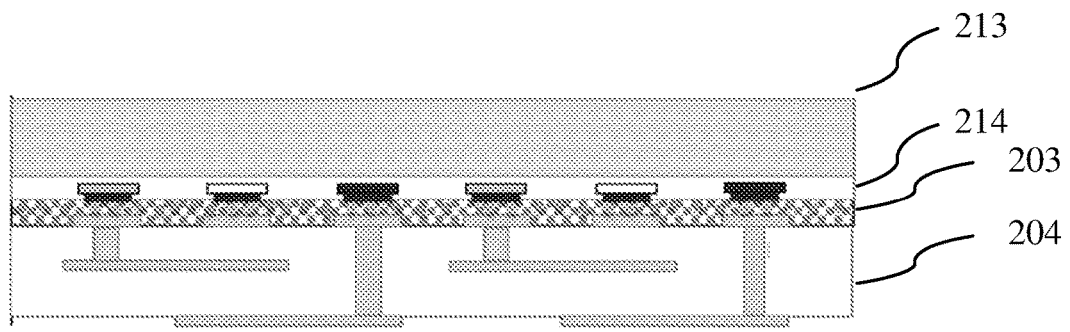

In FIG. 4K, the ACF 203 is processed through the auxiliary substrate 213. For example, the processing condition is that the temperature is be between 150° C. and 200° C., the applied pressure is between 1 MPa and 4 MPa, the time period of applying pressure is between 10 second and 30 second. Through these processes, the ACF 203 interconnects the micro-LEDs with corresponding pad in the vertical direction.

Then, the auxiliary substrate 213 is de-bonded (through the polymer 214).

Figure 4L:
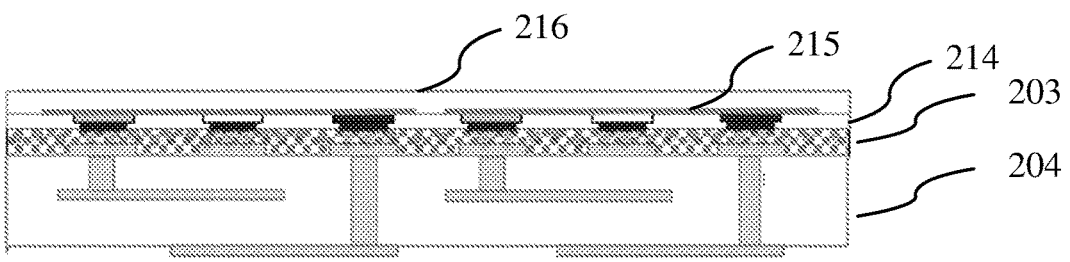

In FIG. 4L, the normal subsequent processes are performed: etching the polymer 214, to expose the epitaxial layers of the micro-LEDs; forming N-metal electrodes 215 (for example, ITO electrodes) on the epitaxial layers of the micro-LEDs; and performing encapsulation 216 on the N-metal electrodes (for example, PET lamination).

Figure 5:
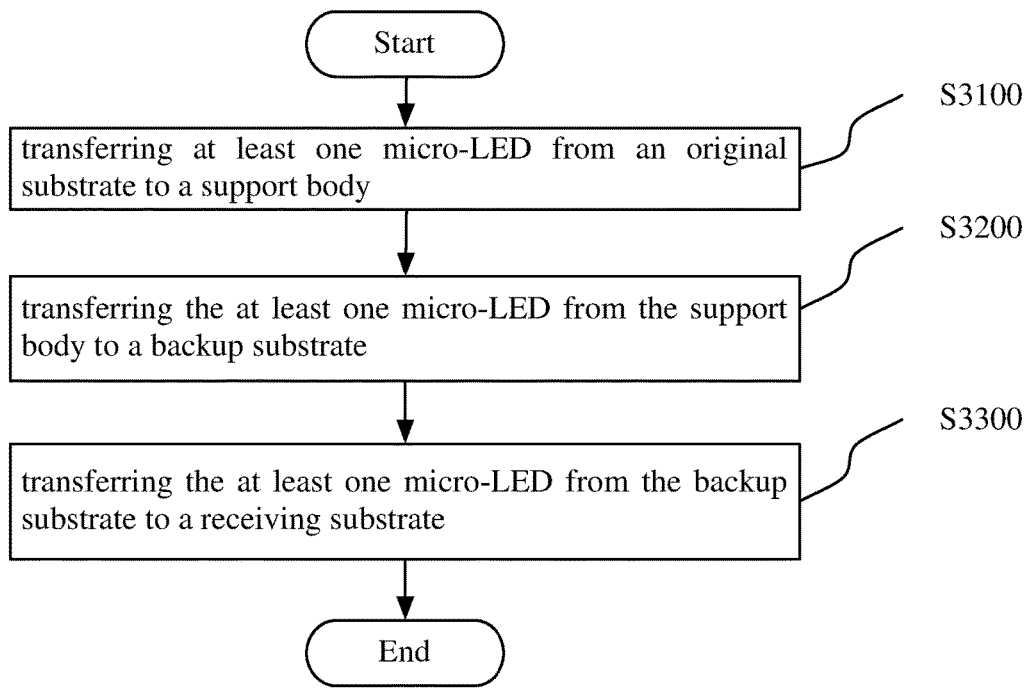
FIG. 5 shows a flow chart of still another illustrative embodiment of the method according to the present invention.

FIG. 5 shows a flow chart of still another illustrative embodiment of the method for transferring a micro-LED according to the present invention.

As shown in FIG. 5, at step S3100, at least one micro-LED is transferred from an original substrate to a support body. For example, the original substrate is laser-transparent.

In an example, this step can comprises: mounting the original substrate onto the support body, wherein the micro-LEDs are formed on the original substrate, the support body has light-release adhesive on its surface, and the micro-LEDs are adhered to the support body via the light-release adhesive; irradiating the original substrate with laser from the original substrate side, for lifting-off the at least one micro-LED from the original substrate, and irradiating light from the support body side, to release un-lifted-off micro-LEDs. In this example, the support body is transparent.

For example, the light-release adhesive can be a UV tape. For example, the support body is stiff. The displacement of micro-LEDs during transfer will have affect on the quality of the final product. The inventors of this application have found that this displacement can be reduced by using a stiff support body. This point has not been noticed by a person skilled in the art. For example, the material of the support body can be PET.

Generally, it is difficult to form red micro-LEDs on a laser-transparent substrate such as a sapphire substrate. Accordingly, in an example, the red micro-LEDs are formed in advance and then are transferred to an original substrate, for being finally transferred to a receiving substrate. For example, in this embodiment, red micro-LEDs can be formed on a growth substrate. Then, the red micro-LEDs are transferred to an intermediate substrate. After that, the red micro-LEDs are transferred from the intermediate substrate to the original substrate.

At step S3200, the at least one micro-LED are transferred from the support body to a backup substrate.

For example, the backup substrate has elastomer or polymer on its surface. For example, the at least one micro-LED are bonded to the backup substrate through the elastomer or polymer.

In an example, this step can further comprises: bonding the support body with the at least one micro-LED to the backup substrate, and irradiating light from the support body side, to release the at least one micro-LED.

At step S3300, the at least one micro-LED are transferred from the backup substrate to a receiving substrate.

In an example, the step can further comprise: aligning the at least one micro-LED with the pads on the receiving substrate; and lifting-off the at least one micro-LED via the elastomer or polymer.

For example, the above transfer steps can be performed with respect to red micro-LEDs, blue micro-LEDs and greed micro-LEDs, respectively. They will not be repeatedly described here.

After the above processes, normal subsequent processes can be done on the micro-LEDs. For example, the subsequent processes include: coating polymer on the receiving substrate with micro-LEDs; curing the polymer; etching the polymer, to expose the epitaxial layers of the micro-LEDs; forming N-metal electrodes on the epitaxial layers of the micro-LEDs; and performing encapsulation on the N-metal electrodes.

The inventors of this invention have found that during the transfer of micro-LEDs, usually, only part of the micro-LEDs on the original substrate are transferred. If the micro-LEDs are directly transferred to a receiving substrate, the remaining micro-LEDs on the original substrate are often contaminated. In this embodiment, this contamination can be reduced through the transfer via an intermediate support body.

In another embodiment, the present invention further provides a method for manufacturing a micro-LED device. The manufacturing method comprises transferring micro-LEDs to a receiving substrate by using the method for transferring micro-LEDs according to this embodiment. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to said embodiment.

In another embodiment, the present invention further provides an electronic apparatus. The electronic apparatus contains a micro-LED device according to the embodiment. For example, the electronic apparatus can be a mobile phone, a pad and so on.

Generally, red micro-LEDs cannot be directly formed on a laser-transparent original substrate such as sapphire substrate. Thus, it is required that red micro-LEDs are formed on an additional substrate in advance, and then are transferred to a sapphire substrate. FIGS. 6A to 6F shows an example for transferring red micro-LEDs according to the present invention.

Figure 6A:
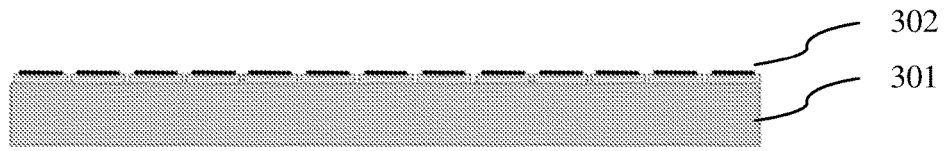
FIGS. 6A to 6F show an example for transferring red micro-LEDs according to the present invention.

As shown in FIG. 6A, red micro-LEDs 302 are formed on a growth substrate 301 such as GaAs substrate.

Figure 6B:
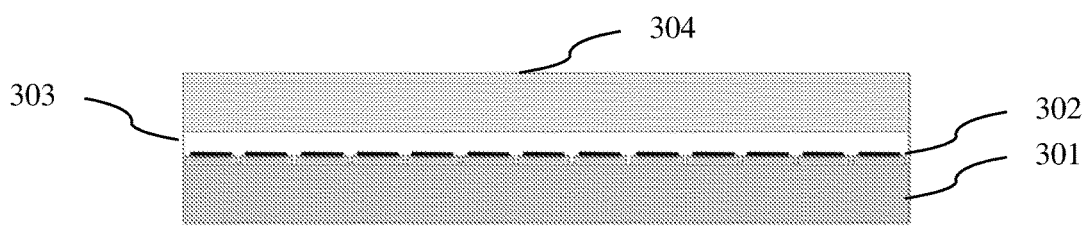

As shown in FIG. 6B, the red micro-LEDs 302 are bonded with intermediate substrate 304 such as silicon substrate, through temporary bonding polymer 303. The polymer 303 is a thermal release tape (TRT), for example.

Figure 6C:
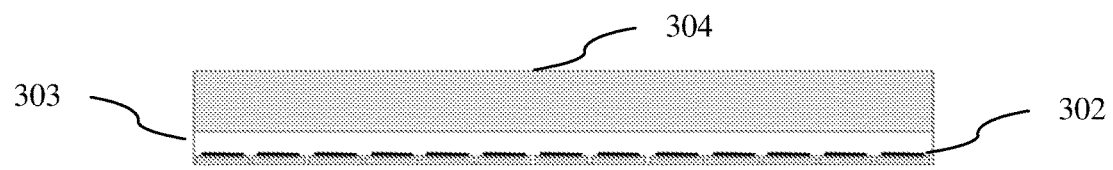

As shown in FIG. 6C, the growth substrate 301 is removed by a wet etching method, for example.

Figure 6D:
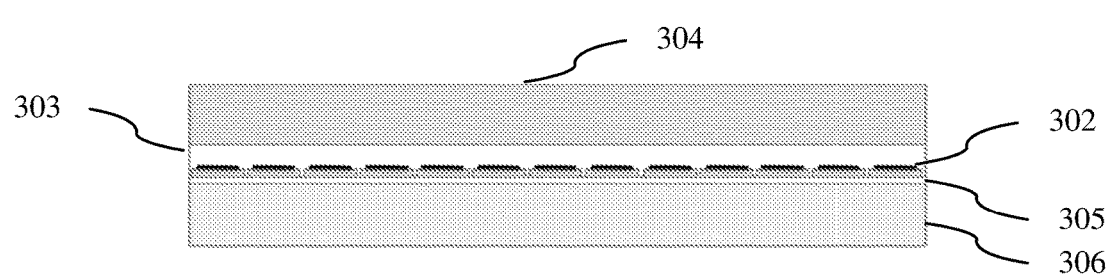

As shown in FIG. 6D, a light resist 305 is coated on an original substrate 306 suc as sapphire substrate. The original substrate 306 and the red micro-LEDs 302 are bonded through the resist 305. The resist 305 can endure the temperature above 200° C.; generally above 250° C.

Figure 6E:
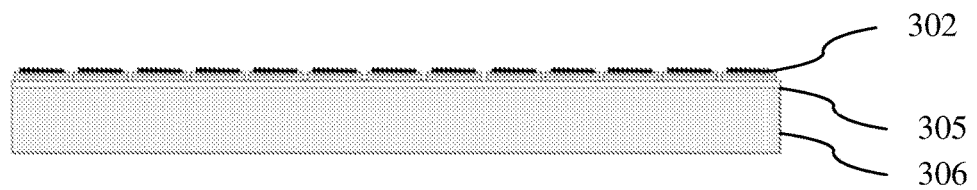

As shown in FIG. 6E, the polymer 303 is processed under a temperature less than 200° C., to remove the intermediate substrate 304.

Figure 6F:
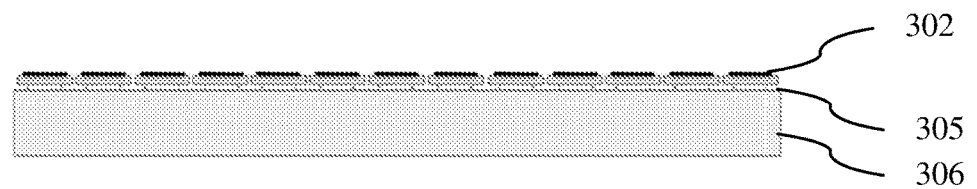

As shown in FIG. 6F, a O2 plasma etching is performed on the resist 305, to isolate the respective red micro-LEDs 302.

FIGS. 7A to 7L shows still another example for transferring a micro-LED according to the present invention.

Figure 7A:
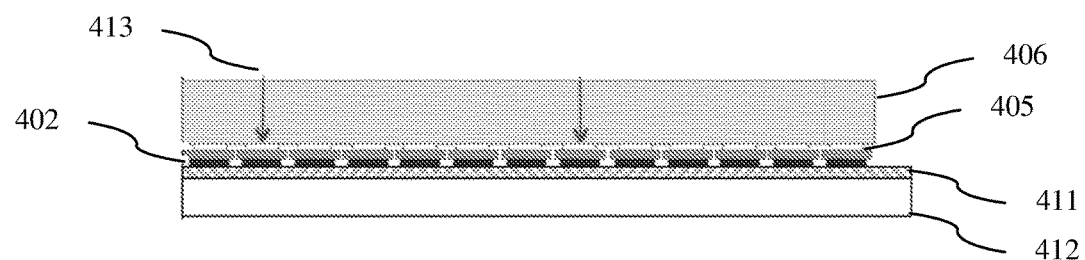
FIGS. 7A to 7L show still another example for transferring a micro-LED according to the present invention.

As shown in FIG. 7A, the original substrate 406 has resist 405 and red micro-LEDs 402 thereon. The red micro-LEDs 402 are mounted onto a UV tape 411. The UV tape 411 is located on a stiff PET support body 402. The red micro-LEDs are selectively lifted-off through laser 413.

Figure 7B:
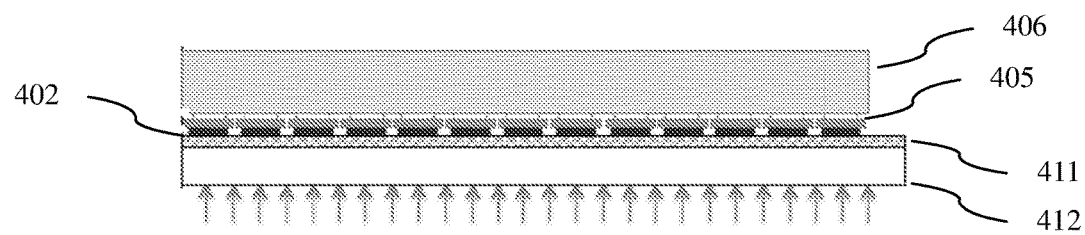

As shown in FIG. 7B, a ultraviolet is irradiated from the support body 412 side, to release un-lifted-off red micro-LEDs.

Figure 7C:
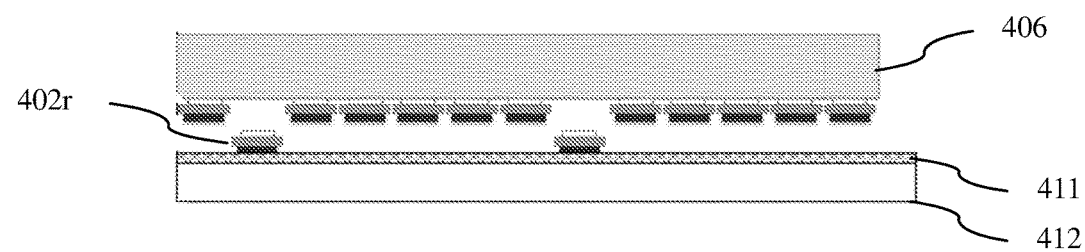

The lifted-off red micro-LEDs 402r are easily separated from the original substrate 406. As shown in FIG. 7C, the lifted-off red micro-LEDs 402r are adhered on the UV tape 411, while other red micro-LEDs remain on the original substrate 406.

Figure 7D:
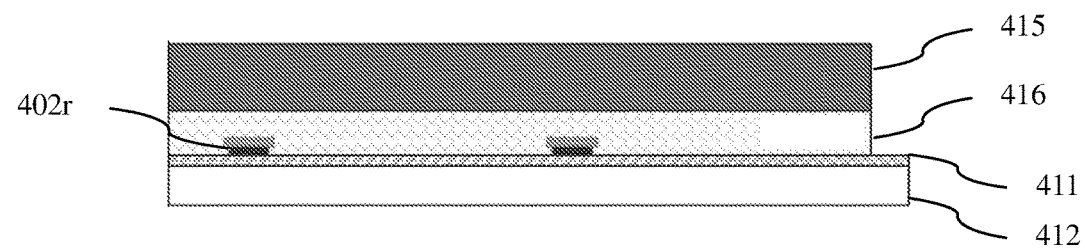

As shown in FIG. 7D, the backup substrate 415 such as glass substrate has elastomer/polymer 416 thereon. For example, the elastomer/polymer 416 is coated on the backup substrate 415 through spin coating. For example, the elastomer/polymer 416 is PDMS or 3M LC 5320, and can be cured through ultraviolet, for example.

Figure 7E:
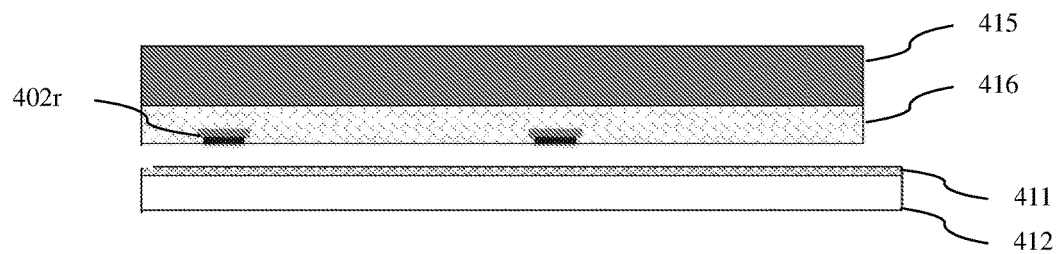
Figure 7F:
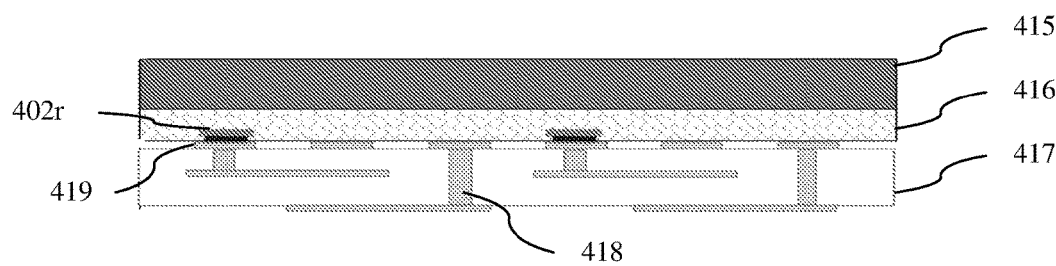

As shown in FIG. 7E, the support body is fully irradiated with ultraviolet, to release the red micro-LEDs and elastomer/polymer 416.

After that, for example, if the micro-LEDs do not have bumps thereon, the micro-LEDs on the backup substrate 415 can be screen-printed using silver paste.

As shown in 7F, the red micro-LEDs on the backup substrate 415 are aligned with the pads 419 on the receiving substrate 417. For example, the receiving substrate is a display substrate, and includes signal leads 418. For example, the red micro-LEDs are bonded to the pads 419 through reflow. The temperature of reflow can be more than 260° C. Then, the backup substrate 415 is separated from the receiving substrate 417 through laser lift-off.

Figure 7G:
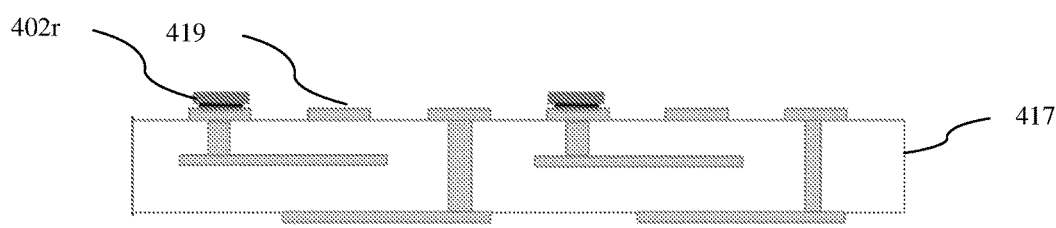

FIG. 7G shows separated receiving substrate 417. The receiving substrate 417 has pads 419 and red micro-LEDs 402r thereon.

Figure 7H:
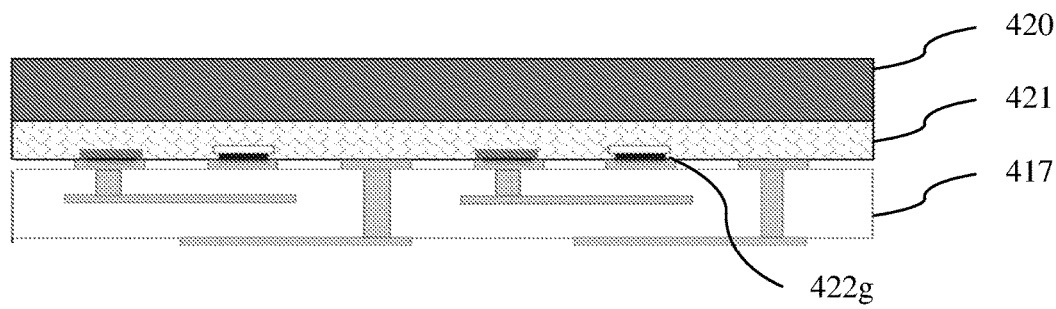

FIG. 7H shows a schematic diagram of transferring red micro-LEDs 422g from a backup substrate 420 to the receiving substrate 417. The backup substrate 420 has elastomer/polymer 421.

Figure 7I:
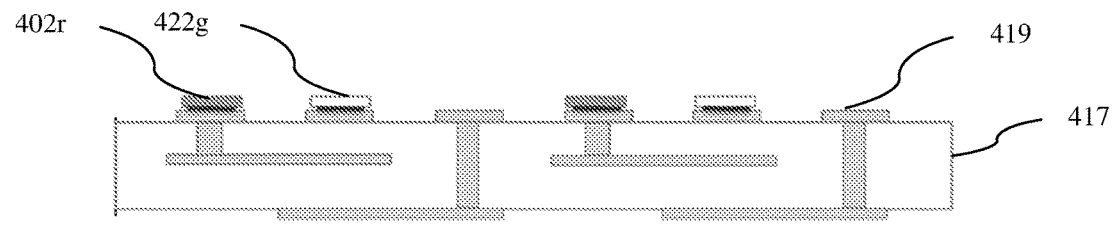

FIG. 7I shows the separated receiving substrate 417. The receiving substrate 417 has pads 419, red micro-LEDs 402r and green micro-LEDs 402r thereon.

Figure 7J:
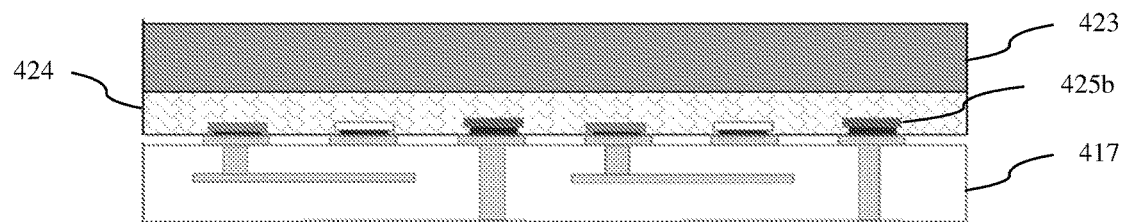

FIG. 7J shows a schematic diagram of transferring blue micro-LEDs 425b from a backup substrate 423 to the receiving substrate 417. The backup substrate 423 has elastomer/polymer 424.

Figure 7K:
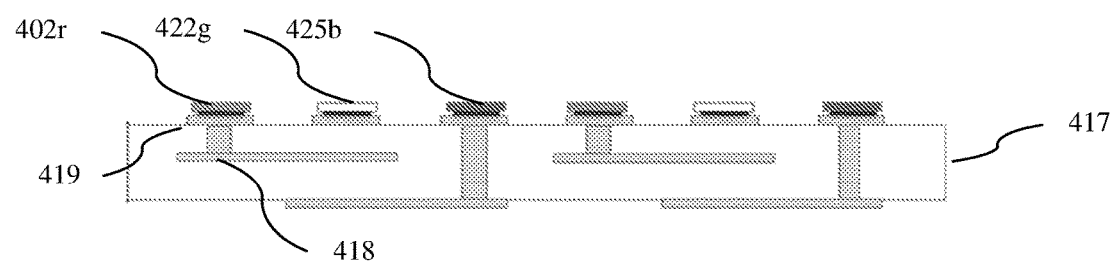
Figure 7L:
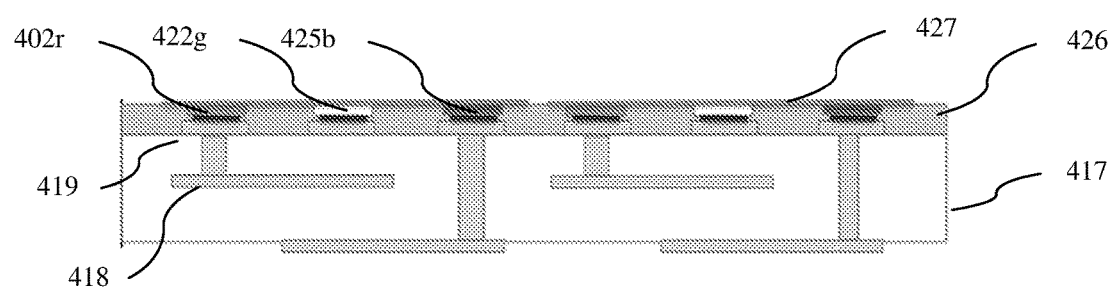

FIG. 7K shows the separated receiving substrate 417. The receiving substrate 417 has pads 419, red micro-LEDs 402r, green micro-LEDs 402r and blue micro-LEDs 425b thereon In FIG. 7L, the normal subsequent processes are performed on the transferred micro-LEDs: coating polymer 426 on the receiving substrate with micro-LEDs; curing the polymer 426; etching the polymer, to expose the epitaxial layers of the micro-LEDs; forming N-metal electrodes 427 on the epitaxial layers of the micro-LEDs; and performing encapsulation (not shown) on the N-metal electrodes.

Figure 8:
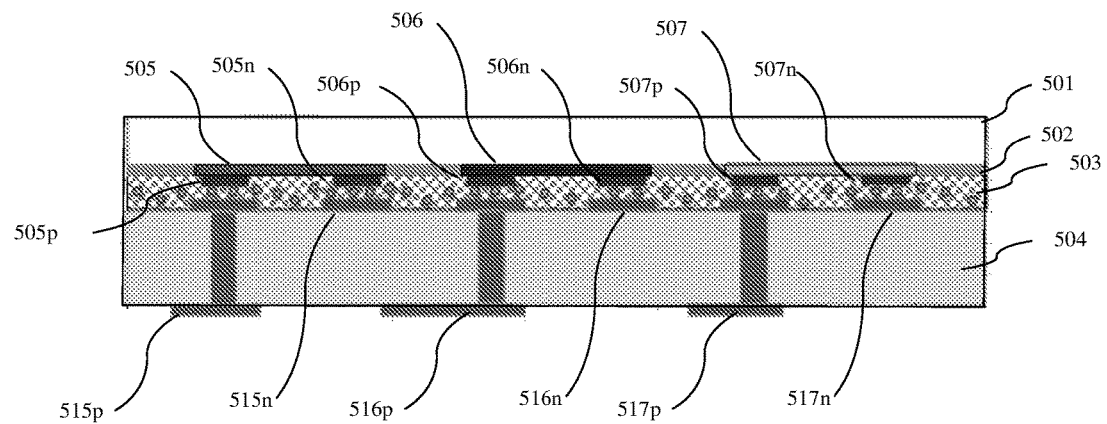
FIG. 8 shows still an example for transferring a lateral micro-LED according to the present invention.

The solution of the present invention can use both vertical micro-LEDs and lateral micro-LEDs (flip-chip micro-LEDs). The micro-LEDs of vertical structure shown in the previous figures are illustrative and do not limit the scope of the present invention. FIG. 8 shows an example of lateral micro-LEDs.

In the example of FIG. 8, the micro-LEDs are lateral micro-LEDs. In the lateral micro-LEDs, the P electrodes and the N electrodes thereof are located on the same side. FIG. 8 shows a red lateral micro-LED 505, a green lateral micro-LED 506 and a blue lateral micro-LED 507. The red lateral micro-LED 505 contains a P electrode 505p (positive electrode) and an N electrode 505n (negative electrode). The green lateral micro-LED 506 contains a P electrode 506p and an N electrode 506n6. The blue lateral micro-LED 507 contains a P electrode 507p and an N electrode 507n.

Lead structures (including pads) 515p, 515n, 516p, 516n, 517p, 517n are provided in the substrate 504. The lead structures 515p, 516p, 517p are for connection with positive electrodes. The lead structures 515n, 516n, 517n are for connection with negative electrodes.

In the example of FIG. 8, the electrodes 505p, 505n, 506p, 506n, 507p, 507n are connected to the lead structures 515p, 515n, 516p, 516n, 517p, 517n via an anisotropic conductive layer 503.

Polymer 502 can be coated between the lateral micro-LEDs. A transparent cover 501 can be provided over the lateral micro-LEDs.

Figure 9:
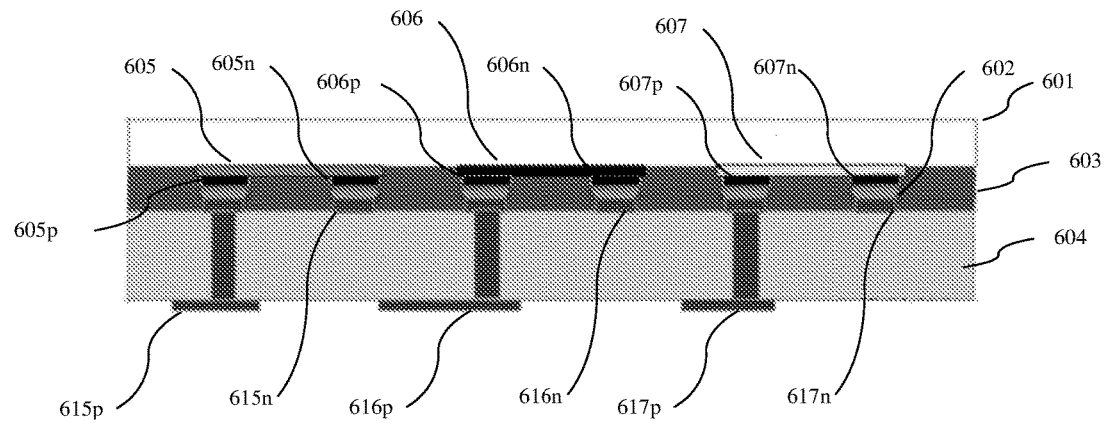
FIG. 9 shows still another example for transferring a lateral micro-LED according to the present invention.

FIG. 9 shows another example of lateral micro-LEDs. The difference between the example of FIG. 9 and that of FIG. 8 lies in that in FIG. 9, the lateral micro-LEDs are connected to the substrate via solder rather than an anisotropic conductive layer.

FIG. 9 shows a red lateral micro-LED 605, a green lateral micro-LED 606 and a blue lateral micro-LED 607. The red lateral micro-LED 605 contains a P electrode 605p and an N electrode 605n. The green lateral micro-LED 606 contains a P electrode 606p and an N electrode 606n. The blue lateral micro-LED 607 contains a P electrode 607p and an N electrode 607n.

Lead structures (including pads) 615p, 615n, 616p, 616n, 617p, 617n are provided in the substrate 604. The lead structures 615p, 616p, 617p are for connection with positive electrodes. The lead structures 615n, 616n, 617n are for connection with negative electrodes.

In the example of FIG. 9, the electrodes 605p, 605n, 606p, 606n, 607p, 607n include solder bumps 602, for example. The solder bumps 602 are coated with flux, for example. The electrodes 605p, 605n, 606p, 606n, 607p, 607n are bonded to the lead structures 615p, 615n, 616p, 616n, 617p, 617n, for example, through reflow-soldering, respectively.

For example, polymer 603 can filled between the lateral micro-LEDs and the substrate 604. A transparent cover 601 can be provided over the lateral micro-LEDs. These processes are well-known in the art and thus are not described in detail here.

Therefore, for example, the present invention can further include the specific application of lateral micro-LEDs. More specifically, the present invention further provides a method for transferring micro-LED. The method comprises: forming micro-LEDs on a laser-transparent original substrate, wherein the micro-LEDs are lateral micro-LEDs whose P electrodes and N electrodes are located on one side; bringing the P electrodes and N electrodes of the lateral micro-LEDs into contact with pads preset on a receiving substrate; and irradiating the original substrate with laser from the original substrate side to lift-off the lateral micro-LEDs from the original substrate.

A technical effect of using lateral micro-LEDs lies in that the processing for N metal electrode after the micro-LED transfer can be omitted. Furthermore, the wafer-level color-binning/testing can be simplified because the P electrodes and N electrodes already exist when a test at wafer-level is performed.

Furthermore, for example, in this method, an anisotropic conductive layer can be provided on a receiving substrate so as to bring the P electrodes and N electrodes of the lateral micro-LEDs into contact with the pads through the anisotropic conductive layer. Then, after lifting-off the lateral micro-LEDs from the original substrate, the anisotropic conductive layer is processed to electrically connect the P electrodes and N electrodes of the lateral micro-LEDs with the pads on the receiving substrate.

For example, the anisotropic conductive layer can be at least one of an anisotropic conductive film, an anisotropic conductive paste and an anisotropic conductive tape.

In addition to bringing the P electrodes and N electrodes of the lateral micro-LEDs into contact with pads preset on a receiving substrate by the stickiness of an anisotropic conductive layer or by the surface tension of liquid (such as flux), the present invention can further realize the contact by actions of gravity, electrostatic force and/or electromagnetic force.

For example, when the original substrate is irradiated with laser from the original substrate side, the lateral micro-LEDs are separated from the original substrate and the lateral micro-LEDs are dropped off onto the receiving substrate because of gravity.

For example, electrostatic force can be applied by applying voltage to the pads, so that the lateral micro-LEDs are dropped off onto the receiving substrate after being lifted-off from the original substrate because of the electrostatic force.

For example, in case that the lateral micro-LEDs contains magnetic substance such as Ni, a magnetic field can be provided, so that the lateral micro-LEDs are dropped off onto the receiving substrate after being lifted-off from the original substrate because of the electromagnetic force.

Similarly, the transfer method in the example of using lateral micro-LEDs can be applied to a method for manufacturing a micro-LED device for transferring the lateral micro-LEDs onto a receiving substrate. For example, the receiving substrate is a display screen or display substrate. The micro-LED device is a display device, for example.

For example, a micro-LED device, such as a display device, can be manufactured by using the manufacturing method. The micro-LED device adopts lateral micro-LEDs.

For example, the present invention further provides an electronic apparatus. The electronic apparatus contains the micro-LED device. For example, the electronic apparatus can be a mobile phone, a pad and so on.

Figure 10:
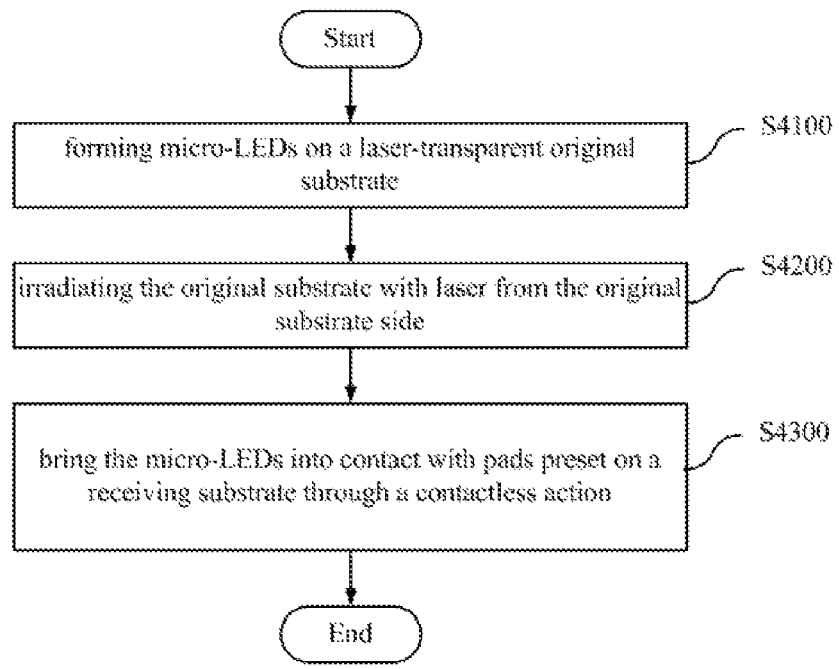
FIG. 10 shows a flow chart of still another illustrative embodiment of the method according to the present invention.

FIG. 10 shows a flow chart of a method for transferring micro-LEDs by means of a contactless action according to the present invention.

As shown in FIG. 10, in the method for transferring micro-LEDs, at step S4100, micro-LEDs are formed on a laser-transparent original substrate.

The micro-LEDs can be lateral micro-LEDs or can be micro-LEDs of vertical structure. In a lateral micro-LED, the P electrodes and N electrodes thereof are located on one same side. In a micro-LED of vertical structure, the P electrodes and N electrodes thereof are located on opposite sides.

At step S4200, the original substrate is irradiated with laser from the original substrate side to lift-off the micro-LEDs from the original substrate.

At step S4300, the micro-LEDs are brought into contact with pads preset on a receiving substrate through a contactless action.

The contactless action means that the action per se can be applied without the direct contact of objects. For example, the contactless action can be applied by means of a field. This is different from the action applied through the stickiness of an anisotropic conductive layer or by the surface tension of liquid (such as flux). It should be understand that although the contactless action per se can be applied without the direct contact of objects, the direct contact of objects can be kept through the contactless action. For example, several example of the contactless action are given as below.

For example, the contactless action is gravity. The micro-LEDs are placed over the receiving substrate. When the lift-off is performed, the micro-LEDs are dropped off on the receiving substrate and is left on the receiving substrate.

For example, the contactless action is electrostatic force. The electrostatic force can be applied by applying voltage to the pads.

For example, the contactless action is electromagnetic force. In case that the micro-LEDs contains magnetic substance, a magnetic field can be provided by means of a magnet such as permanent magnet, so that the micro-LEDs are dropped off and are left onto the receiving substrate after being lifted-off from the original substrate because of the electromagnetic force, thereby contacting with the pads directly or indirectly.

In this embodiment, the micro-LEDs are attached onto the receiving substrate via a contactless manner, which is not conceived by a person skilled in the art.

For example, the electrodes of the micro-LEDs include solder bumps. The solder bumps are bonded with the pads, for example, through reflow-soldering and so on.

The order of steps in FIG. 10 will not constitute any limitation o the present invention. For example, although the step S4200 are shown in front of the step S4030, the action of gravity, the action of electrostatic force or the action of electromagnetic force can be applied before the step S4200 or at the time when performing the step S4200. In another word, for example, the step S4300 can be performed before the step S4200 or simultaneously with the step S4200.

Similarly, the transfer method can be applied to a method for manufacturing a micro-LED device for transferring the micro-LEDs onto a receiving substrate. For example, the receiving substrate is a display screen or display substrate. The micro-LED device is a display device, for example.

For example, a micro-LED device, such as a display device, can be manufactured by using the manufacturing method.

For example, the present invention further provides an electronic apparatus. The electronic apparatus contains the micro-LED device. For example, the electronic apparatus can be a mobile phone, a pad and so on.

Figure 11:
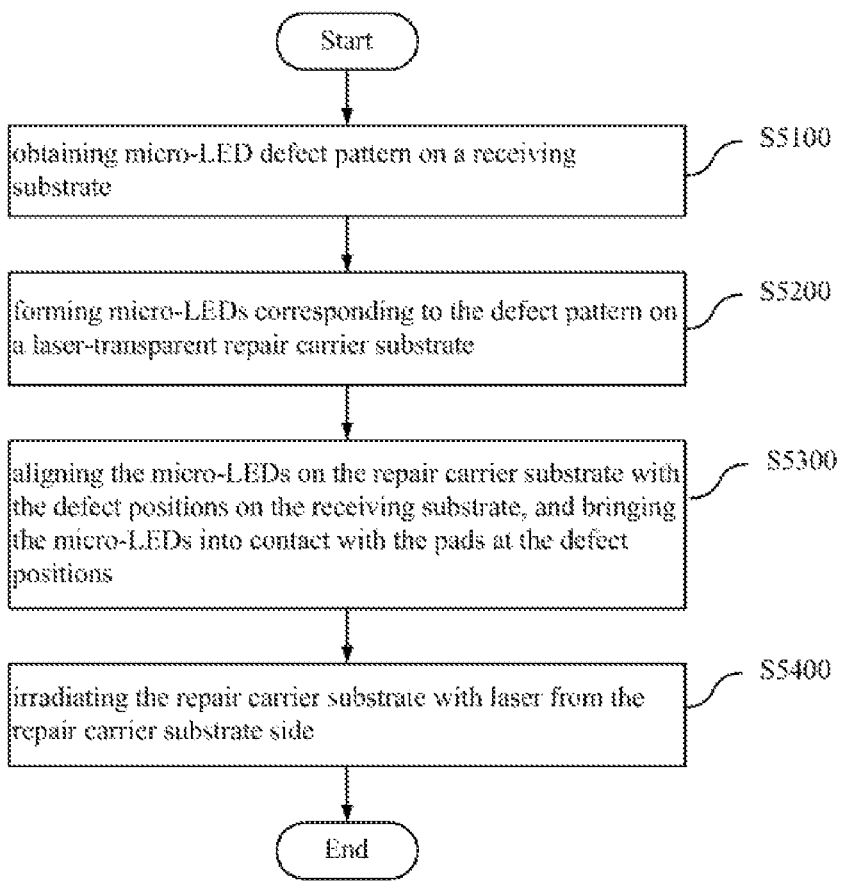
FIG. 11 shows a flow chart of still another illustrative embodiment of the method according to the present invention.

FIG. 11 shows a flow chart of still another illustrative embodiment of the method according to the present invention.

As shown in FIG. 11, at step S5100, a micro-LED defect pattern on a receiving substrate is obtained.

For example, the defect pattern can be obtained through an automatic visual inspection (AVI), a photoluminescence (PL), an electro-optical test, or an electric-performance test, etc. These detection approaches are not the improvement of this invention and can be the prior art, and thus they are not described here in details.

At step S5200, micro-LEDs corresponding to the defect pattern are formed on a laser-transparent repair carrier substrate.

In an example, the micro-LEDs can first be mounted onto a temporary substrate in the defect pattern.

For example, the temporary substrate is rigid, such as a PET plate. For example, an adhesive, such as an UV tape, is coated on the temporary substrate. The micro-LEDs on a laser-transparent original substrate can be brought into contact with the adhesive. Then, the original substrate is irradiated with laser in the defect pattern, to lift-off the micro-LEDs from the original substrate. The lifted-off micro-LEDs in the defect pattern are kept on the temporary substrate while the un-lifted-off micro-LEDs are released through a partial adhesive releasing. After the partial adhesive releasing, the un-lifted-off micro-LEDs remain on the original substrate. The partial adhesive releasing means that after the releasing, the residual stiction of the adhesive is sufficient to separate the lifted-off micro-LEDs from the original substrate while it cannot separate the un-lifted-off micro-LEDs from the original substrate.

Next, the micro-LEDs on the temporary substrate are transferred to the repair carrier substrate.

For example, the micro-LEDs on the temporary substrate can first be bonded onto the repair carrier substrate. The micro-LEDs on the temporary substrate can be bonded onto the repair carrier substrate through a polymer thin film, for example. Then, the micro-LEDs is lifted-off from the temporary substrate through a complete adhesive releasing. For example, after the micro-LEDs is lifted-off from the temporary substrate, at least one part of the polymer thin film is removed, such as the polymer thin film portion between micro-LEDs.

For example, the partial adhesive releasing and the complete adhesive releasing can be performed through UV exposure.

Generally, the exposure time or energy used in the partial adhesive releasing is less than the standard exposure time or energy, i.e. the exposure time in the partial releasing is less than the standard time and/or the energy in the partial releasing is less than the standard energy. The exposure time or energy used in the complete adhesive releasing is higher than or equal to the standard exposure time or energy, i.e. the exposure time in the complete releasing is larger than or equal to the standard time and/or the energy in the complete releasing is larger than or equal to the standard energy. The standard exposure time or energy can be the exposure time or energy just releasing the adhesive completely, or can be the nominal exposure time or energy.

At step S5300, the micro-LEDs on the repair carrier substrate are aligned with the defect positions on the receiving substrate, and the micro-LEDs are brought into contact with the pads at the defect positions.

At step S5400, the repair carrier substrate is irradiated with laser from the repair carrier substrate side, to lift-off the micro-LEDs from the repair carrier substrate.

For example, the repair carrier substrate is a sapphire substrate. As described above, in the present invention, the substrate adopted is laser-transparent. That is, compared with the device such as a micro-LED to be lifted off, the substrate is transparent with respect to the laser to be irradiated, i.e. the substrate has a higher transmittance. Accordingly, the energy in the laser will be mainly absorbed by the device (such as a micro-LED) behind it when it is irradiated, to achieve the lift-off. Of course, the larger the transmittance difference between the laser-transparent substrate and the device is, the better the lift-off effect is.

In another embodiment, the present invention further provides a method for manufacturing a micro-LED device. The manufacturing method comprises repairing micro-LED defects on a receiving substrate by using the method for repairing micro-LED defects according to this embodiment. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to said embodiment.

In another embodiment, the present invention further provides an electronic apparatus. The electronic apparatus contains a micro-LED device according to the embodiment. For example, the electronic apparatus can be a mobile phone, a pad and so on.

After micro-LEDs of large scale are transferred to a receiving substrate, a yield loss to a certain degree will arise. Thus, a repair is necessary at most cases to guarantee the product quality. In the prior art, a pick-up head is used to perform the repair. The repair approach of the prior is relatively complicated and the efficiency thereof is relatively low. The repair approach of this invention is relatively simple and/or has a relatively high efficiency.

FIGS. 12A to 12F show an example for repairing micro-LED defects according to the present invention.

Figure 12A:
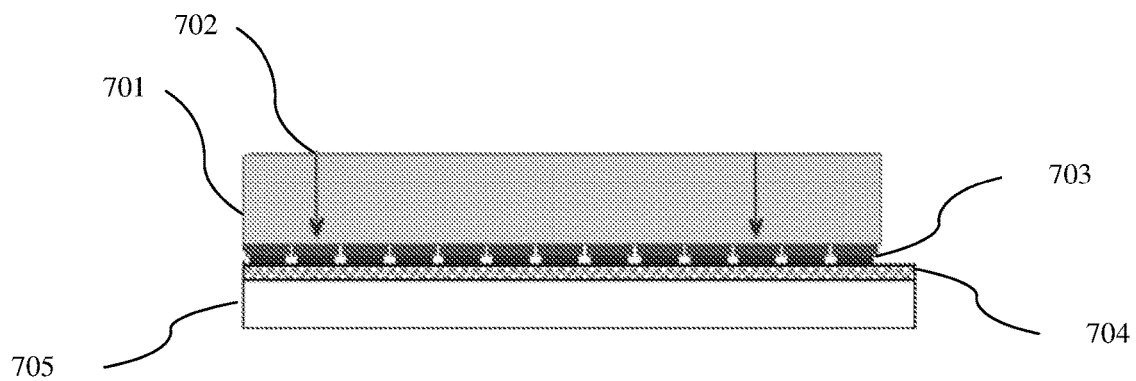
FIGS. 12A to 12F show an example for repairing micro-LED defects according to the present invention.

As shown in FIG. 12A, micro-LEDs 703 are formed on an original substrate 701. The micro-LEDs 703 include defect micro-LEDs and good micro-LEDs. The micro-LEDs are mounted onto a temporary substrate 705 through an adhesive layer 704. The adhesive layer 704 is an UV tape for example. The temporary substrate 705 is a PET plate, for example. The original substrate 701 is irradiated with laser 702 in a defect pattern, to lift off the defect micro-LEDs from the original substrate.

Figure 12B:
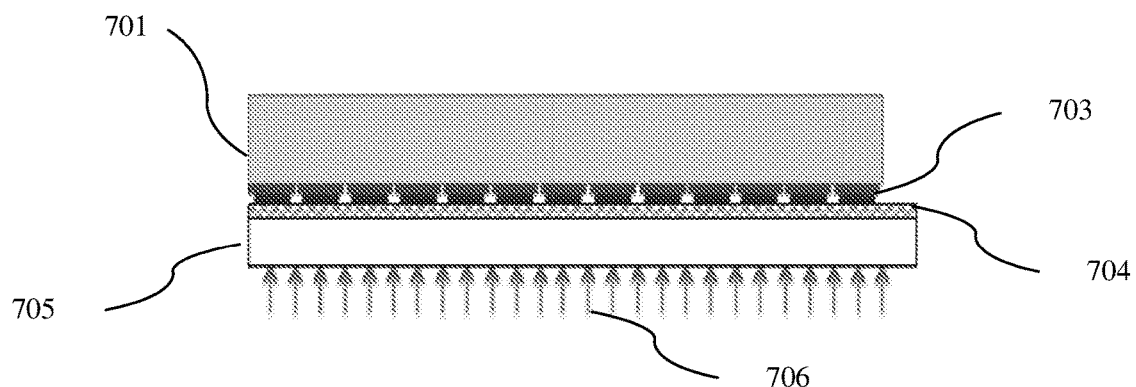

As shown in FIG. 12B, the adhesive layer (the UV tape) 704 is partially exposed with an ultra violet radiation 706 from the side of the temporary substrate 705.

Figure 12C:
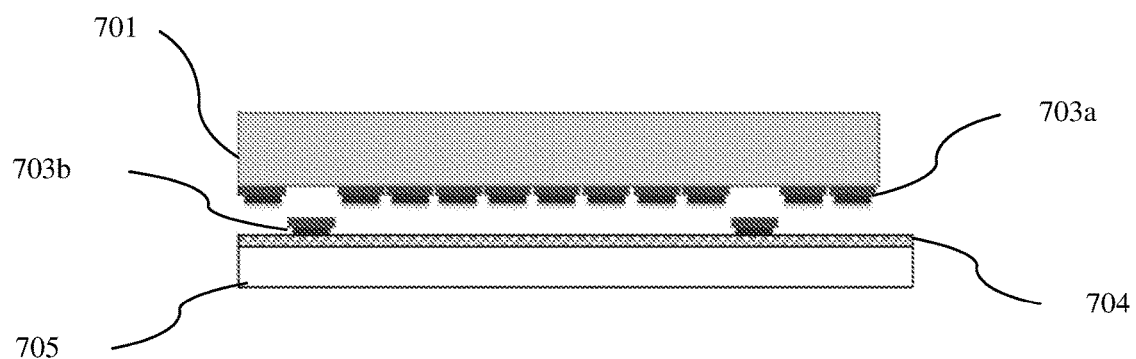

As shown in FIG. 12C, after the partial exposure, the adhesive layer 704 still remain a certain residual stiction sufficient to separate the laser-lifted-off micro-LEDs 703b from the original substrate, while leaving the un-laser-lifted-off micro LEDs 703a on the original substrate. Since the micro-LEDs are lifted off with laser in the defect pattern, the adhesive layer 704 (or the temporary substrate 705) has good micro-LEDs arranged in the defect pattern thereon.

Figure 12D:
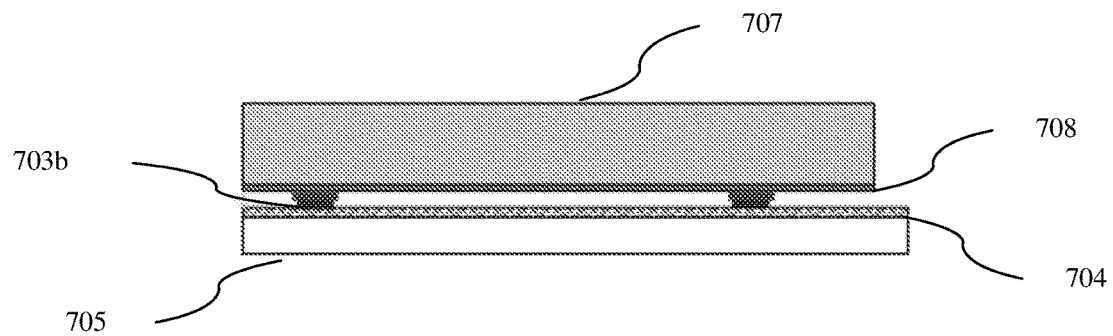
Figure 12E:
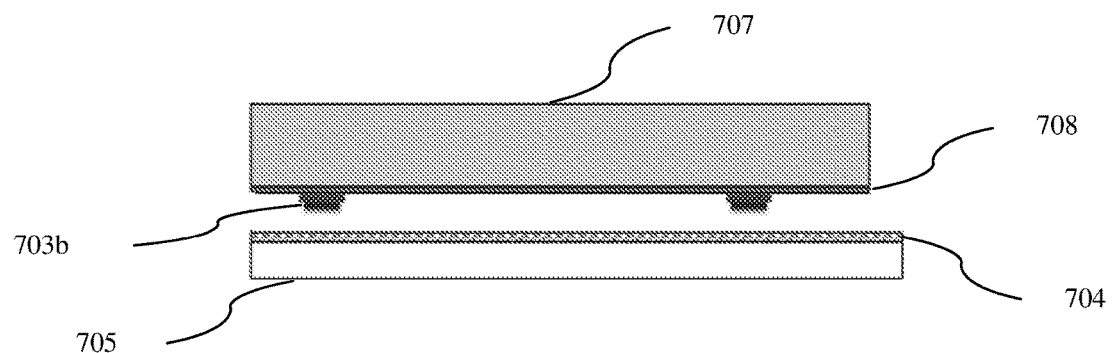
Figure 12F:
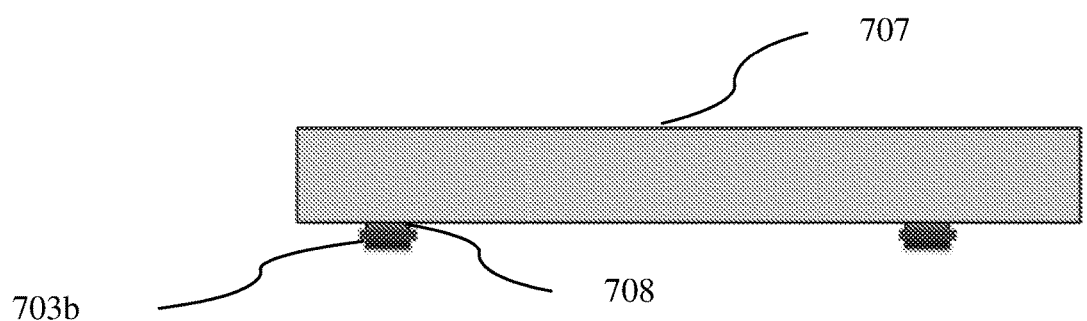

As shown in FIG. 12D, the micro-LEDs 703b on the adhesive layer 704 are temporarily bonded onto a repair carrier substrate 707 through a polymer thin film 708. Then, the adhesive layer 704 is completely exposed. As shown in FIG. 12E, the adhesive layer 704 is separated from the micro-LEDs 703b. FIG. 12F shows the repair carrier substrate 707 and the micro-LEDs 703b in the defect pattern thereon for repairing. As shown in FIG. 12F, the bonding polymer thin film 708 between the micro-LEDs 703b can be removed, leaving the thin film portions between the micro-LEDs 703b and the substrate 707.

Next, the repair carrier substrate 707 can be used for repairing the defects on a receiving substrate by means of laser lifting-off.

Figure 13:
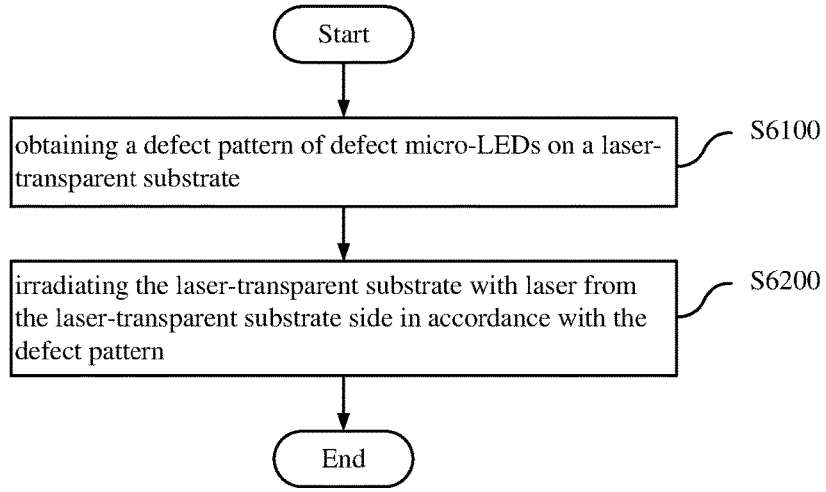
FIG. 13 shows a flow chart of still another illustrative embodiment of the method according to the present invention.

FIG. 13 shows a flow chart of the method for pre-screening defect micro-LEDs of still another illustrative embodiment according to the present invention.

As shown in FIG. 13, at step S6100, a defect pattern of defect micro-LEDs on a laser-transparent substrate is obtained.

For example, the defect pattern can be obtained through an automatic visual inspection, a photoluminescence, an electro-optical test, or an electric-performance test.

At step S6200, the laser-transparent substrate is irradiated with laser from the laser-transparent substrate side in accordance with the defect pattern, to lift-off the defect micro-LEDs from the laser-transparent substrate.

In an example, an action is applied through a contact manner to separate the lifted-off micro-LEDs from the laser-transparent substrate. For example, the micro-LEDs on the laser-transparent substrate can be mounted onto an UV tape. For example, the UV tape is attached on a rigid support body. The defect micro-LEDs are lifted-off through laser to the UV tape and the non-defect micro-LEDs are kept on the laser-transparent substrate though an UV exposure.

In another example, the defect micro-LEDs can be lifted-off from the laser-transparent substrate through a contactless action. As described above, the contactless action is applied without contact. For example, the contactless action is at least one of gravity, electrostatic force and electromagnetic force. These actions can be applied according to the manner described above.

According to the present invention, a repair can be performed after the micro-LEDs are transferred to the receiving substrate, or a repair can be performed on the laser-transparent substrate before the transfer. For example, good micro-LEDs are formed at the position of the lifted-off micro-LEDs on the laser-transparent substrate. The good micro-LEDs can be formed at the defect positions by using the repairing method described above.

In another embodiment, the present invention further provides a method for manufacturing a micro-LED device. The manufacturing method comprises pre-screening defect micro-LEDs defects on a laser-transparent substrate by using the method for prescreening defect micro-LEDs according to this embodiment. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to said embodiment.

In another embodiment, the present invention further provides an electronic apparatus. The electronic apparatus contains a micro-LED device according to the embodiment. For example, the electronic apparatus can be a mobile phone, a pad and so on.

In the prior art, both good micro-LEDs and defect micro-LEDs on a substrate are transferred to a receiving substrate during the transfer. However, according to the solution of this invention, only known-good micro-LEDs are transferred to the receiving substrate.

Figure 14A:
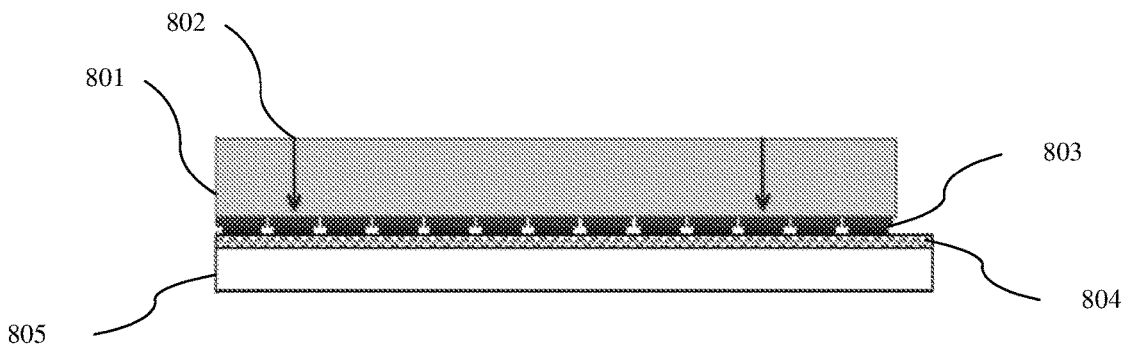
FIGS. 14A to 14C show an example for pre-screening defect micro-LEDs according to the present invention.
Figure 14B:
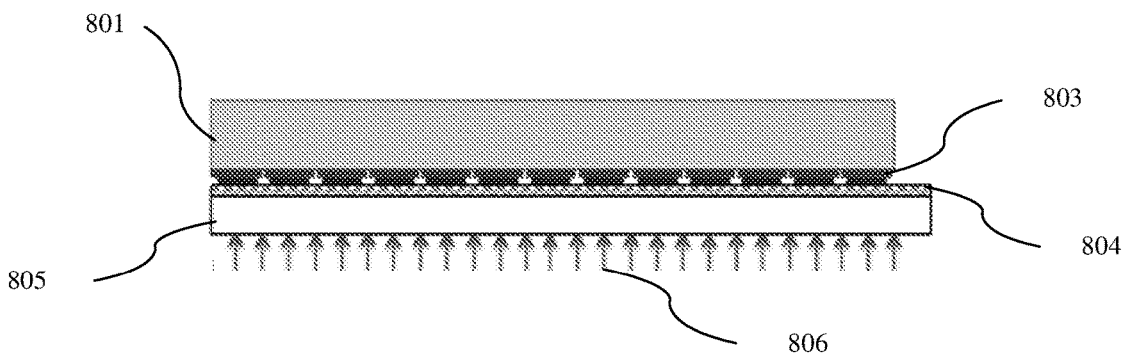
Figure 14C:
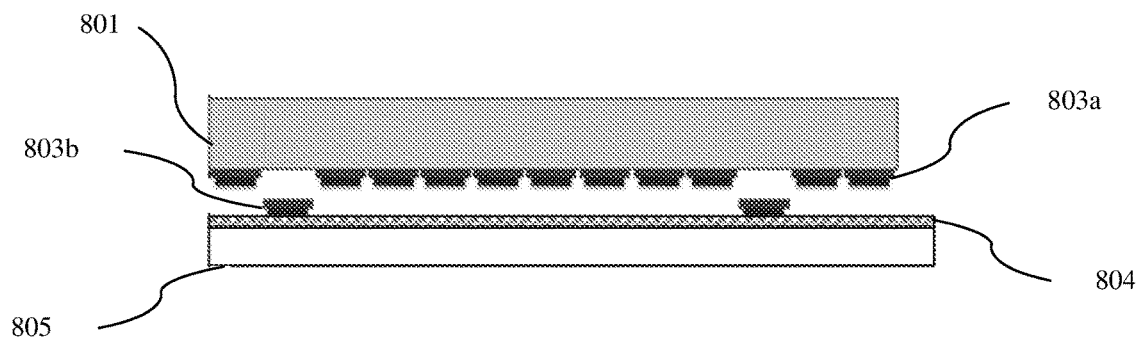

FIGS. 14A to 14C show an example for pre-screening defect micro-LEDs according to the present invention.

In this example, the defect pattern on a laser-transparent substrate is obtained through an automatic visual inspection (AVI), a photoluminescence (PL), an electro-optical test, or an electric-performance test, etc. Then, the laser-transparent substrate is mounted onto a UV tape. As shown in FIG. 14A, the UV tape 804 is placed on a support body 805. The laser-transparent substrate 801 is mounted onto the UV tape 804 via micro-LEDs 803. The substrate 801 is irradiated with laser in the defect pattern, to lift off the defect micro-LEDs from the substrate 801.

As shown in FIG. 14B, the UV tape 804 is partially exposed with an ultra violet radiation 806 from the side of the support body 805.

As shown in FIG. 14C, after the partial exposure, the UV tape 804 still remains a certain residual stiction sufficient to separate the laser-lifted-off micro-LEDs 803b from the substrate 801, while leaving the un-laser-lifted-off micro-LEDs 803a on the substrate 801.

Figure 15A:
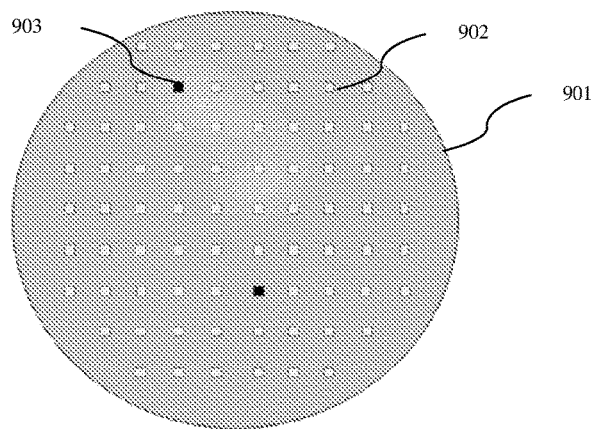
FIGS. 15A to 15B show another example for pre-screening defect micro-LEDs according to the present invention.
Figure 15B:
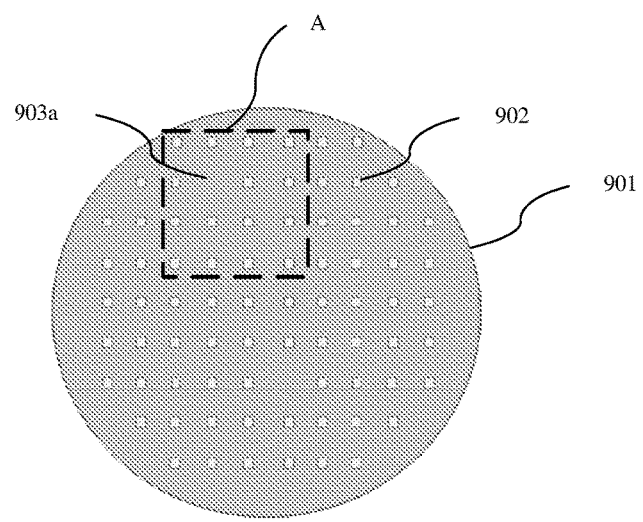

FIGS. 15A to 15B show another example for pre-screening defect micro-LEDs according to the present invention.

As shown in FIG. 15A, the substrate (wafer) 901 has good micro-LEDs 902 and defect micro-LEDs 903 thereon. The defect micro-LEDs 903 are pre-screened before the micro-LEDs are transferred from the substrate 901 to a receiving substrate (not shown), by means of the method of this invention. FIG. 15B shows the substrate 901 after the defect micro-LEDs are pre-screened.

Figure 16A:
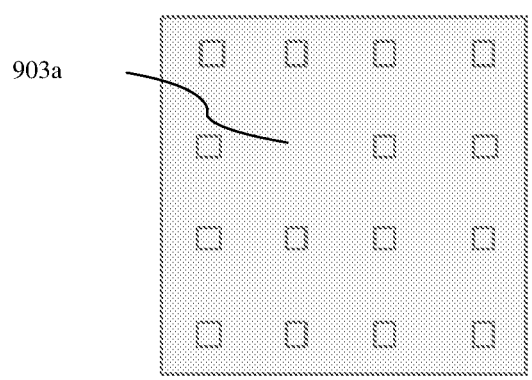
FIGS. 16A to 16B is an enlarged view of the area "A" of FIG. 15B.
Figure 16B:
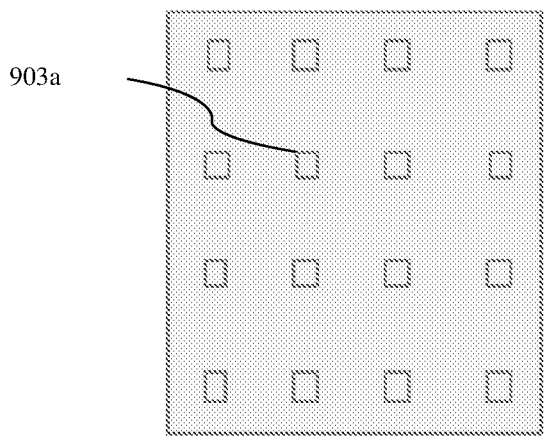

FIGS. 16A to 16B is an enlarged view of the area "A" of FIG. 15B. As shown in FIG. 16A, the defect micro-LED at the position 903a is pre-screened. As shown in FIG. 16B, a repair can be performed directly on the substrate 901, to form a good micro-LED at the position 903a. Alternatively, the repair can be performed after the micro-LEDs are transferred from the substrate 901 to a receiving substrate.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for repairing micro-LED defects, the method comprising the steps of:
   obtaining micro-LED defect pattern on a receiving substrate;
   forming micro-LEDs corresponding to the defect pattern on a laser-transparent repair carrier substrate;
   aligning the micro-LEDs on the repair carrier substrate with the defect positions on the receiving substrate, and bringing the micro-LEDs into contact with the pads at the defect positions; and
   irradiating the repair carrier substrate with laser from the repair carrier substrate side, to lift-off the micro-LEDs from the repair carrier substrate.

2. The method according to claim 1, wherein the step of forming micro-LEDs corresponding to the defect pattern comprises:
   mounting the micro-LEDs onto a temporary substrate in the defect pattern; and
   transferring the micro-LEDs on the temporary substrate to the repair carrier substrate.

3. The method according to claim 2, wherein:
   an adhesive is coated on the temporary substrate, and
   the step of mounting the micro-LEDs onto a temporary substrate comprises:
      bringing micro-LEDs on a laser-transparent original substrate into contact with the adhesive;
      irradiating the original substrate with laser in the defect pattern, to lift-off the micro-LEDs from the original substrate; and
      keeping the lifted-off micro-LEDs in the defect pattern on the temporary substrate while releasing the un-lifted-off micro-LEDs through a partial adhesive releasing.

4. The method according to claim 3, wherein the step of transferring the micro-LEDs on the temporary substrate to the repair carrier substrate comprises:
   bonding the micro-LEDs on the temporary substrate onto the repair carrier substrate; and
   lifting-off the micro-LEDs from the temporary substrate through a complete adhesive releasing.

5. The method according to claim 4, wherein:
   the micro-LEDs on the temporary substrate are bonded onto the repair carrier substrate through a polymer thin film, and
   at least one part of the polymer thin film is removed after the micro-LEDs is lifted-off from the temporary substrate.

6. The method according to claim 3, wherein:
   the adhesive is a UV tape, and
   the temporary substrate is a PET plate.

7. The method according to claim 4, wherein the partial adhesive releasing and the complete adhesive releasing are performed through UV exposure.

8. The method according to claim 7, wherein:
   the exposure time or energy used in the partial adhesive releasing is less than a standard exposure time or energy, and the exposure time or energy used in the complete adhesive releasing is higher than or equal to the standard exposure time or energy.

9. The method according to claim 1, wherein the repair carrier substrate is a sapphire substrate.

10. A method for manufacturing a micro-LED device, said method comprising the step of repairing micro-LED defects on a receiving substrate by using the method according to claim 1.

11. A micro-LED devicenmanufactured by using the method according to claim 10.

12. An electronic apparatus, containing a micro-LED device according to claim 11.

* * * * *